United States Patent
Teshirogi et al.

(10) Patent No.: US 7,710,311 B2
(45) Date of Patent: May 4, 2010

(54) SHORT RANGE RADAR SMALL IN SIZE AND LOW IN POWER CONSUMPTION AND CONTROLLING METHOD THEREOF

(75) Inventors: Tasuku Teshirogi, Tokyo (JP); Masaharu Uchino, Aiko-gun (JP); Sumio Saito, Atsugi (JP); Masanori Ejima, Kuki (JP)

(73) Assignees: Anritsu Corporation, Tokyo (JP); Matsushita Electric Industrial Co., Ltd., Osaka (JP)

( * ) Notice: Subject to any disclaimer, the term of this patent is extended or adjusted under 35 U.S.C. 154(b) by 1000 days.

(21) Appl. No.: 10/582,067
(22) PCT Filed: Oct. 7, 2005
(86) PCT No.: PCT/JP2005/018661

§ 371 (c)(1),
(2), (4) Date: Jun. 8, 2006

(87) PCT Pub. No.: WO2006/041041

PCT Pub. Date: Apr. 20, 2006

(65) Prior Publication Data

US 2009/0256739 A1 Oct. 15, 2009

(30) Foreign Application Priority Data

Oct. 14, 2004 (JP) .............................. 2004-300318

(51) Int. Cl.
G01S 13/00 (2006.01)
G01S 7/292 (2006.01)
G01S 13/10 (2006.01)
(52) U.S. Cl. ...................................................... 342/70
(58) Field of Classification Search .................... 342/70, 342/175, 204

See application file for complete search history.

(56) References Cited

U.S. PATENT DOCUMENTS

| | | | | |
|---|---|---|---|---|
| 7,420,503 | B2 * | 9/2008 | Uchino | 342/70 |
| 2007/0132633 | A1 * | 6/2007 | Uchino | 342/70 |
| 2007/0194978 | A1 * | 8/2007 | Teshirogi et al. | 342/70 |
| 2008/0246650 | A1 * | 10/2008 | Teshirogi et al. | 342/204 |
| 2009/0256739 | A1 * | 10/2009 | Teshirogi et al. | 342/204 |

FOREIGN PATENT DOCUMENTS

| | | | |
|---|---|---|---|
| EP | 1717598 A1 | * | 11/2006 |
| EP | 1736795 A1 | * | 12/2006 |
| EP | 1843170 A1 | * | 10/2007 |
| JP | 7-12921 A | | 1/1995 |
| JP | 8-313619 A | | 11/1996 |
| JP | 2003-194923 A | | 7/2003 |
| JP | 2003-222670 A | | 8/2003 |
| WO | WO 2006041041 A1 | * | 4/2006 |
| WO | WO 2006080454 A1 | * | 8/2006 |
| WO | WO 2006080457 A1 | * | 8/2006 |

OTHER PUBLICATIONS

I. Gresham et al; A Low Noise Broadband SiGe Mixer for 24GHz Ultra-Wideband Automtoive Applications; Radio and Wireless Conference, 2003, RAWCON 2003; Aug. 2003; pp. 361-364.
Federal Communications Commission literature; FCC 02-481 First Report and Order; Feb. 14, 2002; pp. 74, 108.
Notification Concerning Transmittal of Copy of International Preliminary Report on Patentability, Chapter I of the Patent Cooperation Treaty, and Written Opinion of the International Searching Authority, dated Apr. 17, 2007, for PCT/JP2005/018661, 5 sheets.

* cited by examiner

Primary Examiner—Dan Pihulic
(74) Attorney, Agent, or Firm—Frishauf, Holtz, Goodman & Chick, P.C.

(57) ABSTRACT

A transmitter section radiates a short range wave to a space. A receiver section has a detector circuit composed of a branch circuit which receives a reflection wave of the short range wave radiated to the space by means of the transmitter section and branches in phase a signal of the reflection wave into first and second signals, a linear multiplier which linearly multiplies the first and second signals branched in phase by means of the branch circuit, and a low pass filter which samples a baseband component from an output signal from the linear multiplier. A signal processor section carries out an analyzing process of an object which exists in the space based on an output from the receiver section. A control section makes a predetermined control with respect to at least one of the transmitter section and the receiver section based on an analysis result from the signal processor section.

22 Claims, 13 Drawing Sheets

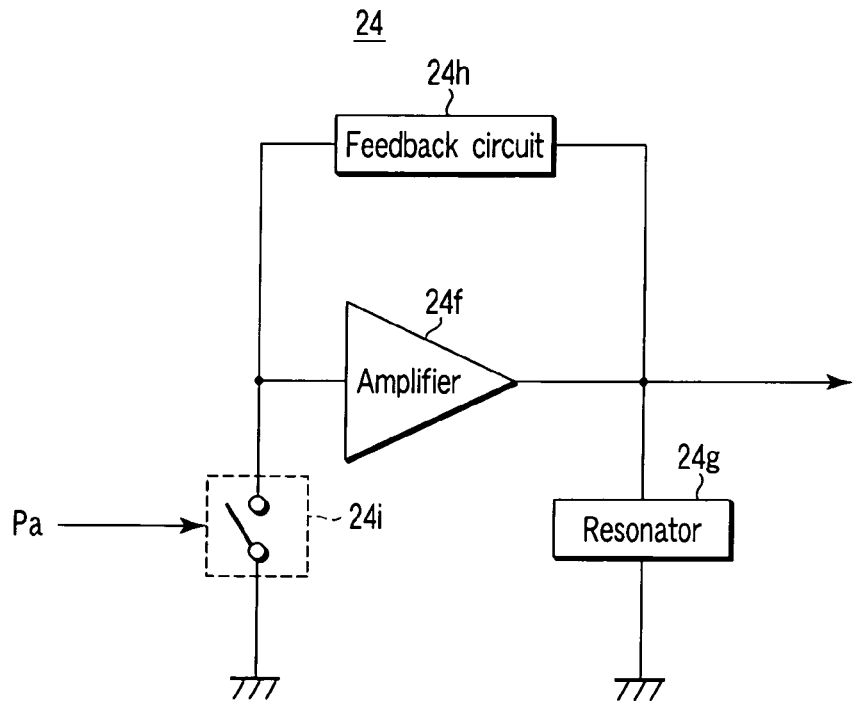
F I G. 4
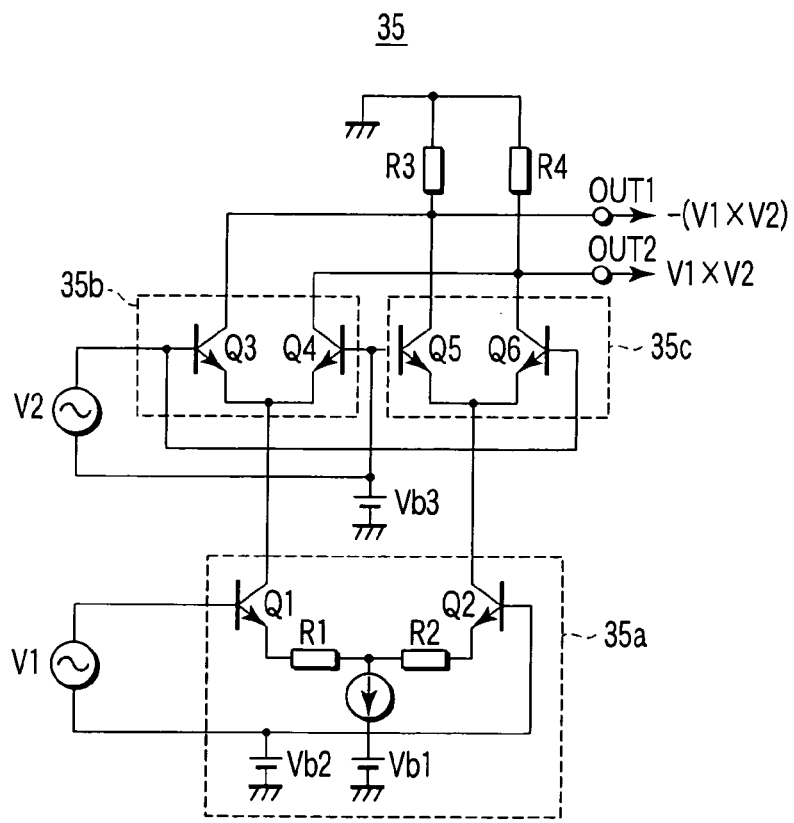
F I G. 5A

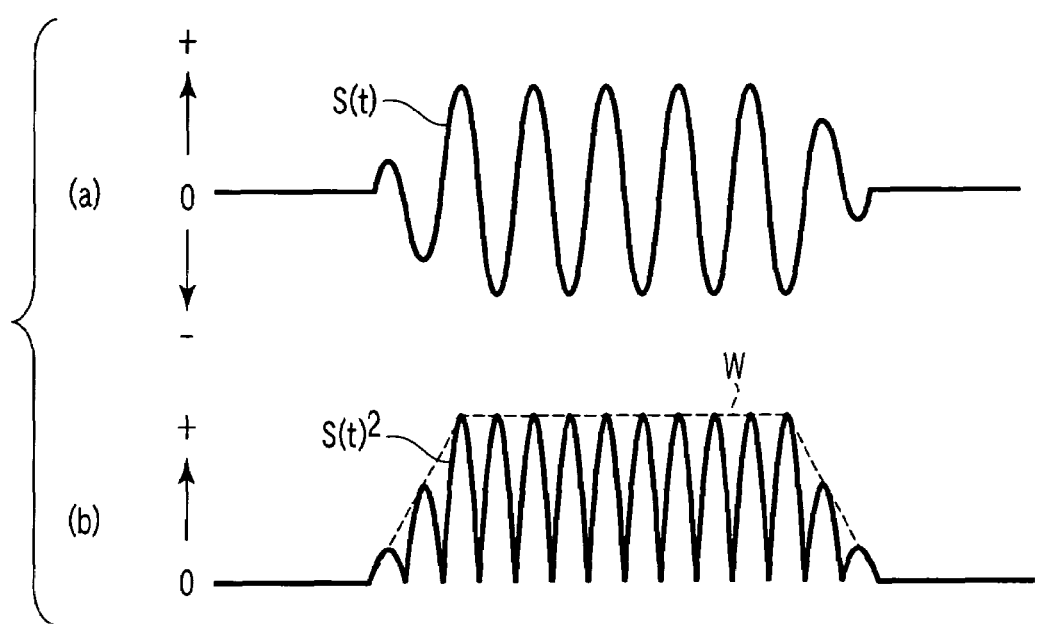
F I G. 6

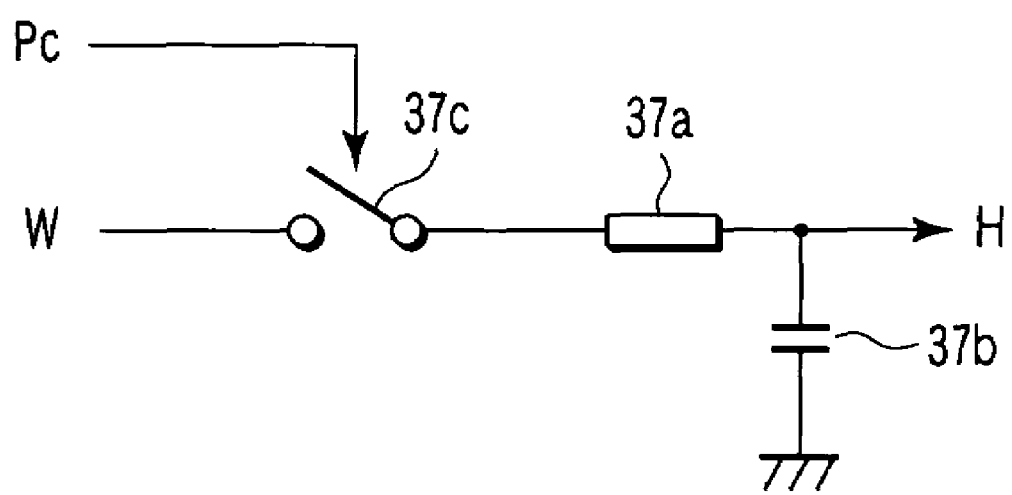
F I G. 10

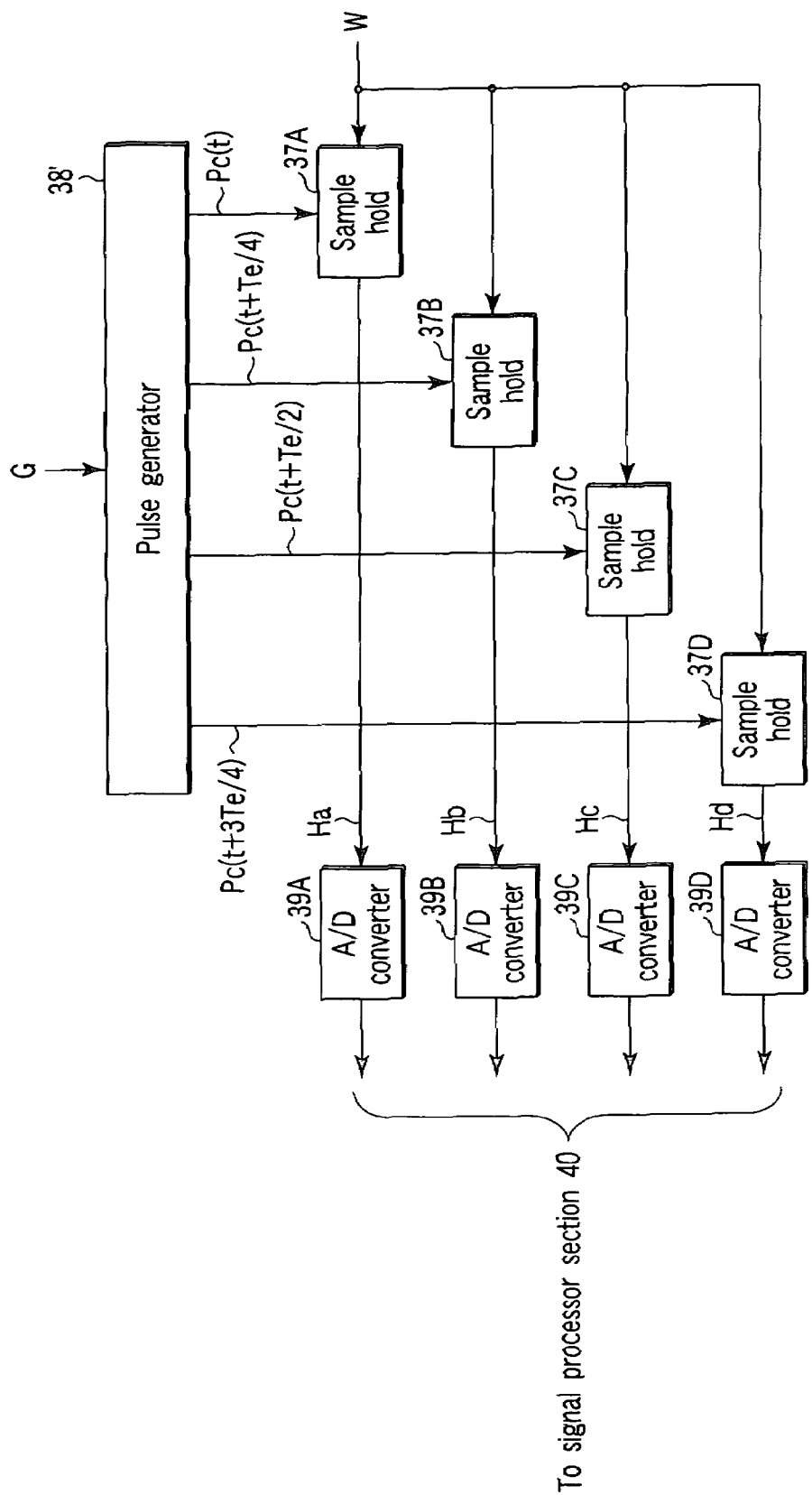
F I G. 12

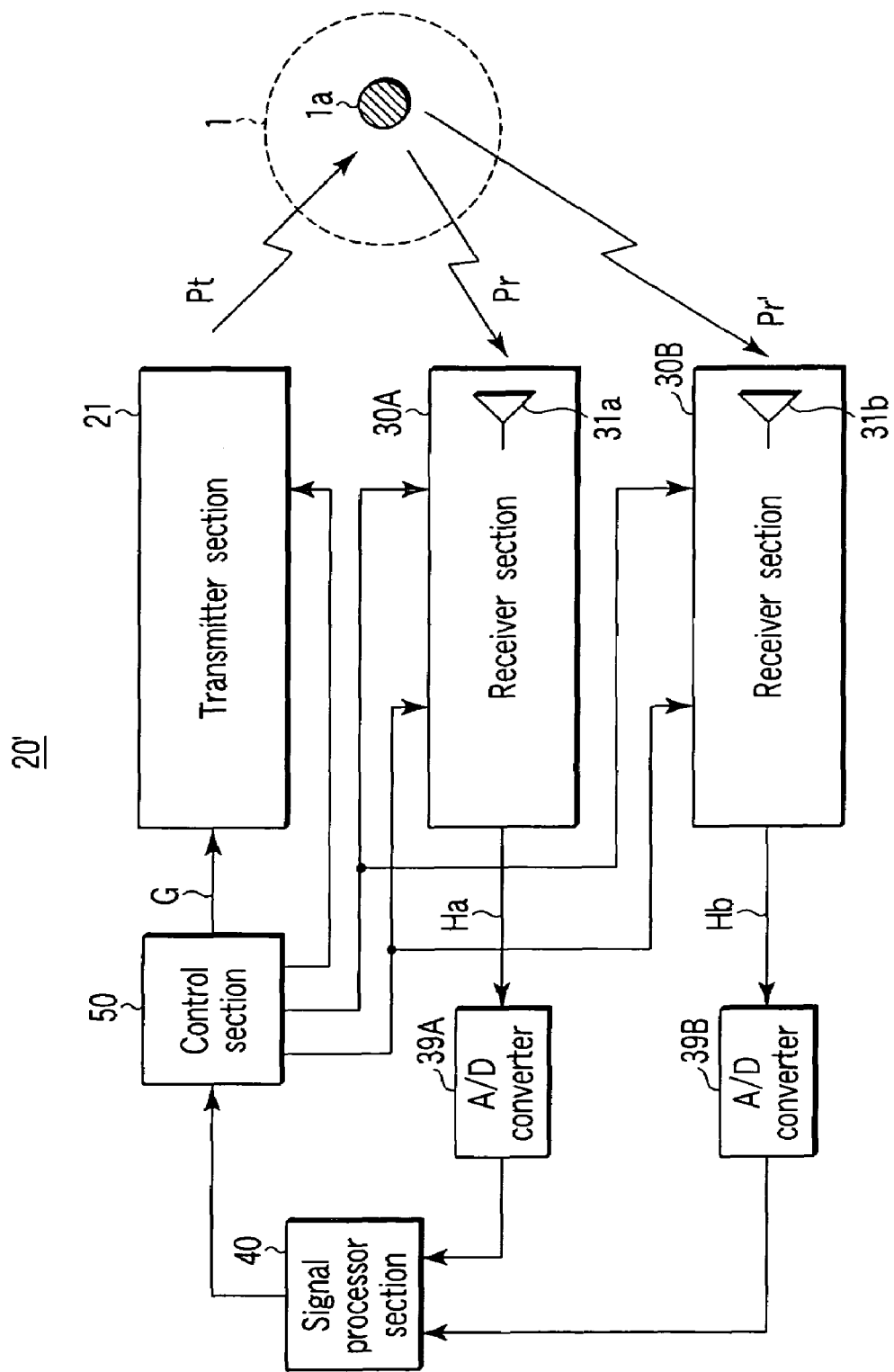
F I G. 13

SHORT RANGE RADAR SMALL IN SIZE AND LOW IN POWER CONSUMPTION AND CONTROLLING METHOD THEREOF

This application is a U.S. National Phase Application under 35 USC 371 of International Application PCT/JP2005/018661 filed Oct. 7, 2005.

TECHNICAL FIELD

The present invention relates to short range radars and a method for controlling thereof. In particular, the present invention relates to short range radars and a method for controlling thereof employing a technique for achieving, with a simple and small sized construction, short range radars used in the range of a quasi millimeter band (UWB: Ultra-wideband) from 22 GHz to 29 GHz allocated for automotive radars or radars for walk assistance of visually handicapped persons, in particular, and achieving low power consumption, from among short range radars for radiating pulse waves of narrow width (short range waves) to a space in a predetermined cycle, receiving and detecting a reflection wave from an object which exists in the space, and analyzing the object which exists in the space based on its detected output.

BACKGROUND ART

A pulse radar for investigating an object in space by using conventionally known pulse waves basically has a construction as shown in FIG. 14.

That is, in this pulse radar 10 shown in FIG. 14, upon the receipt of a trigger signal G outputted in a predetermined cycle Tg from a control section 16 described later, a transmitter section 11 generates a pulse wave Pt having a predetermined width and a predetermined carrier frequency synchronized with the trigger signal G and radiates the generated pulse wave to a space via a transmitter antenna 11a.

This pulse wave Pt is reflected by means of an object 1a which exists in a space 1, and its reflection wave Pr is received by a receiver antenna 12a of a receiver section 12, and then, the received wave is detected by means of a detector circuit 13.

A signal processor section 15 analyzes the object 1a which exists in the space 1 based on a timing with which a detected output D is outputted from the receiver section 12 while a timing with which a pulse wave is transmitted from the transmitter section 11 is defined as a reference timing, for example, or its outputted waveform.

The control section 16 makes a variety of controls with respect to the transmitter section 11 and the receiver section 12 based on a processing result or the like of the signal processor section 15.

A basic construction of such pulse radars 10 is disclosed in patent documents 1 and 2 below.

Patent document 1: Jpn. Pat. Appln. KOKAI Publication No. 7-012921

Patent document 2: Jpn. Pat. Appln. KOKAI Publication No. 8-313619

From among the pulse radars having such a basic construction, the following two types of pulse radars are devised as automotive radars which have been practically available in recent years.

The development of pulse radars of a first type is underway for the purpose of assistance at the time of high speed running such as prevention of collision of automobiles or running control by investigating a narrow angle range with high output and in long distance using a millimeter wave band (77 GHz).

The development of pulse radars of a second type is underway for the purpose of assistance at the time of low speed running such as automobile dead angle assistance or assistance of putting a car in garage by investigating a wide angle range with low output and in long distance using a quasi millimeter wave (22 GHz to 29 GHz).

The quasi millimeter band for use in the pulse radars of this second type is generally referred to as an UWB (Ultra-wideband), and is used for medical radars, radars for walk assistance of visually handicapped persons, or a short distance communication system or the like as well as automotive radars.

The UWB is a wide bandwidth, and thus, in a radar system, a short pulse having a width shorter than 1 ns can be used, and it is expected that short range radars having high distance resolution can be achieved.

DISCLOSURE OF INVENTION

However, in actuality, there are a variety of problems to be solved, which will be described later, in order to achieve short range radars having high distance resolution using this UWB.

One of the important problems is that, although there is a need for downsizing and low power consumption in incorporation of automotive radars into a variety of vehicles or portable use of radars for walk assistance of visually handicapped persons, conventional pulse radars cannot respond to such a need sufficiently.

That is, from the fact that phase information can be obtained by a receiver section 12 of the conventional pulse radars, a quadrature type detector circuit is used as a detector circuit 13.

This quadrature type detector circuit 13, as shown in FIG. 15, branches an input signal S in phase by means of a distributor 13a, and inputs the branched signals to two mixers 13b and 13c, respectively.

Here, a local signal L is inputted to the two mixers 13b and 13c, respectively, after divided into signals each having a 90-degree phase difference by means of a 90-degree distributor 13d.

Then, the two mixers 13b and 13c mix the input signal S with the local signal L divided into the signals each having a 90-degree phase difference.

The local signal L is used to branch a part of the pulse waves (transmission waves) from the transmitter section 11 shown in FIG. 14, for example.

Then, two filters 13e and 13f sample baseband components I and Q from the output components from the two mixers 13b and 13c.

A computing process for these baseband components I and Q is carried out by means of a signal processor section 15 shown in FIG. 14 after processed via a sample hold circuit or an A/D converter and the like, although not shown, for example, thereby making it possible to grasp strength and a phase of an input signal S, i.e., a reflection wave Pr from the object 1a shown in FIG. 14.

Hence, such a quadrature type detector circuit 13 not only requires two mixers 13b and 13c but also requires two systems such as a circuit that follows these mixers, such as a sample hold circuit or an A/D converter, for example, and there is a problem that an equipment construction of the pulse radars becomes complicated, resulting in higher cost.

Further, the quadrature type detector circuit 13 requires an amplifier or the like because there is a need for supplying a local signal with sufficient power to the two mixers 13*b* and 13*c*, and there is a problem that a whole equipment construction of pulse radars becomes complicated, resulting in high power consumption.

In addition, a 90-degree distributor 13*d* in a quasi millimeter band is proper in a circular "rat race" type because of its distribution constant type and a small loss.

Hence, there is a problem that this "rat race" type structured 90-degree distributor 13*d* is hardly hybridized with an IC circuit, and a circuit construction becomes large-sized.

In addition, a frequency of a local signal L for use in the quadrature type detector circuit 13 is a receiving frequency itself, and moreover, is at a high level, as described above. Thus, there is a need for heavy shielding so as to prevent the cable run or receiving of the leak component. Therefore, there is a problem that equipment downsizing becomes difficult.

On the other hand, it is possible to consider use of a peak detector circuit with a diode used in power measurement or the like instead of using the quadrature type detector circuit with its complicated construction and high power consumption as described above.

Hence, the peak detector circuit with a diode is low in response speed in principle, and cannot detect a receiving signal having a short pulse of 1 ns or less as described above.

In addition, in the case where a target serving as an object 1*a* has a high reflection factor such as a metal plate, a transmission pulse waveform is analogous to a receiving waveform reflected and returned from the target.

In this case, as described previously, the quadrature type detector circuit 13 used as a local signal by branching a transmission wave is employed as a detector circuit, a correlation of a detected output is obtained by means of a signal processor section 15, thereby making it possible to detect a target with high sensitivity.

Hence, with respect to a target having dispersion property such as a human body, even if the quadrature type detector circuit 13 is employed as a detector circuit, a receiving pulse has a long tail, and its waveform is different from an ideal waveform. Thus, there is a problem a correlation output becomes small, and a radars sensing capability is lowered.

The present invention has been made in order to solve the above-described problems associated with the conventional technique. It is an object of the present invention to provide short range radars and a method for controlling the short range radars which are available in UWB, small sized, and low in power consumption.

In order to achieve the above-described objects, according to a first aspect of the present invention, there is provided a short range radar comprising: a transmitter section (21) which radiates a short range wave (Pt) to a space (1); a receiver section (30) having a detector circuit (33) composed of a branch circuit (34) which receives a reflection wave (Pr) of the short range wave (Pt) radiated to the space (1) by means of the transmitter section (21) and branches in phase a signal (R') of the reflection wave (Pr) into first and second signals (V1, V2), a linear multiplier (35) which linearly multiplies the first and second signals (V1, V2) branched in phase by means of the branch circuit (34), and a low pass filter (36) which samples a baseband component from an output signal from the linear multiplier (35); a signal processor section (40) which carries out an analyzing process of an object (1*a*) which exists in the space (1) based on an output from the receiver section (30); and a control section (50) which makes a predetermined control with respect to at least one of the transmitter section (21) and the receiver section (30) based on an analysis result from the signal processor section (40).

In order to achieve the above-described objects, according to a second aspect of the present invention, there is further provided the short range radar according to the first aspect, wherein the linear multiplier (35) of the detector circuit (33) is composed of a Gilbert mixer.

In order to achieve the above-described objects, according to a third aspect of the present invention, there is further provided the short range radar according to the first aspect, wherein the receiver section (30) has a sample hold circuit (37) which carries out integration with respect to an output signal of the detector circuit (33) and holds and outputs a result of the integration.

In order to achieve the above-described objects, according to a fourth aspect of the present invention, there is further provided the short range radar according to the third aspect, wherein the control section (50) variably controls an integration start timing and an integration time of the sample hold circuit (37) based on a processing result from the signal processor section (40).

In order to achieve the above-described objects, according to a fifth aspect of the present invention, there is further provided the short range radar according to the first aspect, wherein a plurality of sample hold circuits (37A, 37B, 37C, 37D) are provided as the sample hold circuit (37), and the plurality of sample hold circuits (37A, 37B, 37C, 37D) each carry out integration in different periods from each other with respect to the output signal from the detector circuit (33).

In order to achieve the above-described objects, according to a sixth aspect of the present invention, there is further provided the short range radar according to the first aspect, wherein a power amplifier (25) which amplifies the short range wave (Pt) is provided at the transmitter section (21), a low noise amplifier (32) which amplifies a signal of the reflection wave (Pr) is provided at the receiver section (30), and the control section (50) controls a gain of at least one of the power amplifier (25) provided at the transmitter section (21) and the low noise amplifier (32) provided at the receiver section (30) so that a signal level (R') of the reflection wave (Pr) inputted to the detector circuit (33) at the receiver section (30) is within a linear operation range of the linear multiplier.

In order to achieve the above-described objects, according to a seventh aspect of the present invention, there is further provided the short range radar according to the first aspect, wherein the transmitter section (21) is provided with: a pulse generator (23) which generates a pulse signal (Pa) having a predetermined width; and an oscillator (24) which operates to oscillate only in a period in which the pulse signal (Pa) from the pulse generator (23) is inputted and outputs an output signal (Pb) as the short range wave (Pt), and stops the oscillating operation in a period in which the pulse signal (Pa) is not inputted.

In order to achieve the above-described objects, according to an eighth aspect of the present invention, there is further provided the short range radar according to the first aspect, wherein the control section (50) stops power supply to the transmitter section (21) in a period in which the transmitter section (21) radiates the short range wave (Pt) to the space (1), and radiates a next short range wave (Pt) to the space (1).

In order to achieve the above-described objects, according to a ninth aspect of the present invention, there is further provided the short range radar according to the first aspect, wherein the control section (50) stops power supply to the receiver section (30) in a period in which the transmitter section (21) radiates the short range wave (Pt) to the space (1), and then, radiates a next short range wave (Pt) to the space (1) except a period in which a reflection wave (Pr) relevant to the short range wave (Pt) radiated to the space (1) is received by means of the receiver section (30).

In order to achieve the above-described objects, according to a tenth aspect of the present invention, there is further provided the short range radar according to the first aspect, wherein first and second receiver sections (30A, 30B) are provided as the receiver section (30), each of which has first and second receiving antennas (31A, 31B) provided to be spaced from each other with a predetermined distance in order to receive the reflection wave (Pr), and the signal processor section (40) analyzes a direction of an object (1a) which exists in the space (1) based on output signals from the first and second receiver sections (30A, 30B).

In order to achieve the above-described objects, according to an eleventh aspect of the present invention, there is further provided the short range radar according to the second aspect, wherein the Gilbert mixer used as the linear multiplier (35) of the detector circuit (33) comprises: a first differential amplifier (35a) comprising first and second transistors (Q1, Q2) each having a base input end, a collector output end, and an emitter common current path, the emitter common current path of the first and second transistors (Q1, Q2) being connected to a constant current source (I1); a second differential amplifier (35b) comprising third and fourth transistors (Q3, Q4) each having a base input end, a collector output end, and an emitter common current path, the emitter common current path of the third and fourth transistors (Q3, Q4) being connected to a collector output end of the first transistor (Q1) of the first differential amplifier (35a); a third differential amplifier (35c) comprising fifth and sixth transistors (Q5, Q6) each having a base input end, a collector output end, and an emitter common current path, the base input end of the fifth transistor (Q5) being connected in common to the base input end of the fourth transistor (Q4) of the second differential amplifier (35b), the emitter common current path of the fifth and sixth transistors (Q5, Q6) being connected to a collector output end of the second transistor (Q2) of the first differential amplifier (35a); a first load resistor (R3) and a first output end (OUT1) connected in common to a collector output end of the third transistor (Q3) of the second differential amplifier (35b) and a collector output end of the fifth transistor (Q5) of the third differential amplifier (35c), respectively; a second load resistor (R4) and a second output end (OUT2) connected in common to a collector output end of the fourth transistor (Q4) of the second differential amplifier (35b) and a collector output end of the sixth transistor (Q6) of the third differential amplifier (35c), respectively; a first low pass filter (LPF1) including first and second coils (L1, L2) and a first resistor (R9) and a second low pass filter (LPF2) including third and fourth coils (L3, L4) and a second resistor (R10) connected in series, respectively, between a first pair of lines (+, −) and an earth line which transmits the first signal (V1) branched in phase by means of the branch circuit (34); a third low pass filter (LPF3) including fifth and sixth coils (L5, L6) and a third resistor (R11) and a fourth low pass filter (LPF4) including seventh and eighth coils (L7, L8) and a fourth resistor (R12) connected in series, respectively, between a second pair of lines (+, −) and an earth line which transmits the second signal (V2) branched in phase by means of the branch circuit (34); first and second emitter follower circuits (EF1, EF2) comprising seventh and eighth transistors (Q7, Q8) each having a base input end and an emitter output end, the base input ends of the seventh and eighth transistors (Q7, Q8) each being connected to each of connecting neutral points of the first and second coils (L1, L2) and the third and fourth coils (L3, L4) as each of the output ends of the first and second low pass filters (LPF1, LPF2); third and fourth emitter follower circuits (EF3, EF4) comprising ninth and tenth transistors (Q9, Q10) each having a base input end and an emitter output end, the base input ends of the ninth and tenth transistors (Q9, Q10) each being connected to each of connecting neutral points of the fifth and sixth coils (L5, L6) and the seventh and eighth coils (L7, L8) as each of the output ends of the third and fourth low pass filters (LPF3, LPF4); a fifth low pass filter (LPF5) composed of: a ninth coil (L9) connected between a common collector output end of the third transistor (Q3) of the second differential amplifier (35b) and the fifth transistor (Q5) of the third differential amplifier (35c) and the first load resistor (R3); a tenth coil (L10) connected between the common collector output end of the third transistor (Q3) of the second differential amplifier (35b) and the fifth transistor (Q5) of the third differential amplifier (35c) and the first output end (OUT1); and the first load resistor (R3); and a sixth low pass filter (LPF6) composed of: an eleventh coil (L11) connected between a common collector output end of the fourth transistor (Q4) of the second differential amplifier (35b) and the sixth transistor (Q6) of the third differential amplifier (35c) and the second load resistor (R4); a twelfth coil (L12) connected between a common collector output end of the fourth transistor (Q4) of the second differential amplifier (35b) and the sixth transistor (Q6) of the third differential amplifier (35c) and the second output end (OUT2); and the second load resistor (R4), wherein each of the base input ends of the first and second transistors (Q1, Q2) of the first differential amplifier (35a) is connected to each of the output ends of the first and second emitter follower circuits (EF1, EF2), respectively, and thereby the first signal (V1) branched in phase by means of the branch circuit (34) is inputted to the first differential amplifier (35a); and each of the base input ends of the third transistor (Q3) of the second differential amplifier (35b) and the sixth transistor (Q6) of the third differential amplifier (35c) is connected to each of the output ends of the third and fourth emitter follower circuits (EF3, EF4), respectively, and thereby the second signal (V2) branched in phase by means of the branch circuit (34) is inputted to the second and third differential amplifiers (35b, 35c), and thereby a linearly multiplied outputs of the first and second signals (V1, V2) can be led out from at least one of the first and second output ends (OUT1, OUT2).

In order to achieve the above-described objects, according to a twelfth aspect of the present invention, there is provided a short range radar controlling method comprising the steps of: preparing a transmitter section (21), a receiver section (30), and a linear multiplier (35); radiating a short range wave (Pt) to a space (1) by means of the transmitter section (21); receiving a reflection wave (Pr) of the short range wave (Pt) radiated to the space (1) by means of the receiver section (30) to branch in phase a signal (R') of the reflection wave (Pr) into first and second signals (V1, V2); linearly multiplying the first and second signals (V1, V2) by means of the linear multiplier (35) to output a linearly multiplied signal; sampling a baseband component from an output signal of the linear multiplier; carrying out an analyzing process of an object (1a) which exists in the space (1) based on the baseband component; and making a predetermined control with respect to at least one of the transmitter section (21) and the receiver section (30) based on a result of the analyzing process.

In order to achieve the above-described objects, according to a thirteenth aspect of the present invention, there is further provided the short range radar controlling method according to the twelfth aspect, wherein the step of outputting the linearly multiplied signal comprises the step of carrying out linear multiplication for outputting the linearly multiplied signal by using a Gilbert mixer as the linear multiplier (35).

In order to achieve the above-described objects, according to a fourteenth aspect of the present invention, there is further provided the short range radar controlling method according to the twelfth aspect, further comprising the step of, before the step of carrying out the analyzing process, carrying out integration with respect to the baseband component and holding and outputting a result of the integration.

In order to achieve the above-described objects, according to a fifteenth aspect of the present invention, there is further provided the short range radar controlling method according to the fourteenth aspect, wherein the step of carrying out integration with respect to the baseband component comprises the step of variably controlling a start timing of integration and an integration time with respect to the baseband component based on the result of the analyzing process.

In order to achieve the above-described objects, according to a sixteenth aspect of the present invention, there is further provided the short range radar controlling method according to the fourteenth aspect, wherein the step of carrying out integration with respect to the baseband component comprises the step of carrying out integration in a plurality of periods different from each other with respect to the baseband component by using a plurality of sample hold circuits (37).

In order to achieve the above-described objects, according to a seventeenth aspect of the present invention, there is further provided the short range radar controlling method according to the twelfth aspect, wherein a power amplifier (25) which amplifies the short range wave (Pt) is provided at the transmitter section (21), a low noise amplifier (32) which amplifies a signal (R) of the reflection wave (Pr) is provided at the receiver section (30), and the step of making the predetermined control comprises a step of controlling a gain of at least one of the power amplifier (25) provided at the transmitter section (21) and the low noise amplifier (32) provided at the receiver section (30) so that a signal (R') level of the reflection wave (Pr) at the receiver section (30) is within a linear operation range of the linear multiplier (35).

In order to achieve the above-described objects, according to an eighteenth aspect of the present invention, there is further provided the short range radar controlling method according to the twelfth aspect, wherein the step of radiating a short range wave (Pt) to a space (1) by means of the transmitter section (21) comprises the steps of: generating a pulse signal (Pa) having a predetermined width; making an oscillation operation only in a period in which the pulse signal (Pa) is inputted to output an output signal (Pb) as the short range wave (Pt); and stopping an oscillation operation during a period in which the pulse signal (Pa) is not inputted so as not to output an output signal (Pb) as the short range wave (Pt).

In order to achieve the above-described objects, according to a nineteenth aspect of the present invention, there is further provided the short pulse radar controlling method according to the twelfth aspect, wherein the step of making the predetermined control comprises the step of: stopping power supply to the transmitter section (21) in a period in which the transmitter section (21) radiates the short range wave (Pt) to the space (1), and then, radiates a next short range wave (Pt) to the space (1).

In order to achieve the above-described objects, according to a twentieth aspect of the present invention, there is further provided the short range radar controlling method according to the twelfth aspect, wherein the step of making the predetermined control comprises the step of; stopping power supply to the receiver section (30) in a period in which the transmitter section (21) radiates the short range wave (Pt) to the space (1), and then, radiates a next short range wave (Pt) to the space (1) except a period in which a reflection wave (Pr) with respect to the short range wave (Pt) radiated to the space (1) is received by means of the receiver section (30).

In order to achieve the above-described objects, according to a twenty-first aspect of the present invention, there is further provided the short range radar controlling method according to the twelfth aspect, wherein first and second receiver sections (30A, 30B) are provided as the receiver section (30), each of which has first and second receiving antennas (31A, 31B) provided to be spaced from each other with a predetermined distance in order to receive the reflection wave (Pr), and the step of carrying out the analyzing process comprises the step of analyzing a direction of an object (1a) which exists in the space (1) based on output signals from the first and second receiver sections (30A, 30B).

In order to achieve the above-described objects, according to a twenty-second aspect of the present invention, there is further provided the short range radar controlling method according to the twelfth aspect, wherein, in the step of outputting the linearly multiplied signal, the Gilbert mixer used as the linear multiplier (35) comprises: a first differential amplifier (35a) comprising first and second transistors (Q1, Q2) each having a base input end, a collector output end, and an emitter common current path, the emitter common current path of the first and second transistors (Q1, Q2) being connected to a constant current source (I1); a second differential amplifier (35b) comprising third and fourth transistors (Q3, Q4) each having a base input end, a collector output end, and an emitter common current path, the emitter common current path of the third and fourth transistors (Q3, Q4) being connected to a collector output end of the first transistor (Q1) of the first differential amplifier (35a); a third differential amplifier (35c) comprising fifth and sixth transistors (Q5, Q6) each having a base input end, a collector output end, and an emitter common current path, the base input end of the fifth transistor (Q5) being connected in common to the base input end of the fourth transistor (Q4) of the second differential amplifier (35b), the emitter common current path of the fifth and sixth transistors (Q5, Q6) being connected to a collector output end of the second transistor (Q2) of the first differential amplifier (35a); a first load resistor (R3) and a first output end (OUT1) connected in common to a collector output end of the third transistor (Q3) of the second differential amplifier (35b) and a collector output end of the fifth transistor (Q5) of the third differential amplifier (35c), respectively; a second load resistor (R4) and a second output (OUT2) end connected in common to a collector output end of the fourth transistor (Q4) of the second differential amplifier (35b) and a collector output end of the sixth transistor (Q6) of the third differential amplifier (35c), respectively; a first low pass filter (LPF1) including first and second coils (L1, L2) and a first resistor (R9) and a second low pass filter (LPF2) including third and fourth coils (L3, L4) and a second resistor (R10) connected in series, respectively, between a first pair of lines (+, −) and an earth line which transmits the first signal (V1) branched in phase by means of the branch circuit (34); a third low pass filter (LPF3) including fifth and sixth coils (L5, L6) and a third resistor (R11) and a fourth low pass filter (LPF4) including seventh and eighth coils (L7, L8) and a fourth resistor (R12) connected in series, respectively, between a second pair of lines (+, −) and an earth line which transmits the second signal (V2) branched in phase by means of the branch circuit (34); first and second emitter follower circuits (EF1, EF2) comprising seventh and eighth transistors (Q7, Q8) each having a base input end and an emitter output end, the base input ends of the seventh and eighth transistors (Q7, Q8) each being connected to each of connecting neutral points of the first and second coils (L1, L2) and the third and fourth coils (L3, L4) as each of the output ends of the first and second low pass filters (LPF1, LPF2); third and fourth emitter follower circuits (EF3, EF4) comprising ninth and tenth transistors (Q9, Q10) each having a base input end and an emitter output end, the base input ends of the ninth and tenth transistors (Q9, Q10) each being connected to each of connecting neutral points of the fifth and sixth coils (L5, L6) and the seventh and eighth coils (L7, L8) as each of the output ends of the third and fourth low pass filters (LPF3, LPF4); a fifth low pass filter (LPF5) composed of: a ninth coil (L9) connected between a common collector output end of the third transistor (Q3) of the second differential amplifier (35b) and the fifth transistor (Q5) of the third differential amplifier (35c) and the first load resistor (R3); a tenth coil (L10) connected between the common collector output end of the third transistor (Q3) of the second differential amplifier (35b) and the fifth transistor (Q5) of the third differential amplifier (35c) and the first output end (OUT1); and the first load resistor (R3); and a sixth low pass filter (LPF6) composed of: an eleventh coil (L11) connected between a common collector output end of the fourth transistor (Q4) of the second differential amplifier (35b) and the sixth transistor (Q6) of the third differential amplifier (35c) and the second load resistor (R4); a twelfth coil (L12) connected between the common collector output end of the fourth transistor (Q4) of the second differential amplifier (35b) and the sixth transistor (Q6) of the third differential amplifier (35c) and the second output end (OUT2); and the second load resistor (R4), wherein each of the base input ends of the first and second transistors (Q1, Q2) of the first differential amplifier (35a) is connected to each of the output ends of the first and second emitter follower circuits (EF1, EF2), respectively, and thereby the first signal (V1) branched in phase by means of the branch circuit (34) is inputted to the first differential amplifier (35a), each of the base input ends of the third transistor (Q3) of the second differential amplifier (35b) and the sixth transistor (Q6) of the third differential amplifier (35c) is connected to each of the output ends of the third and fourth emitter follower circuits (EF3, EF4), respectively, and thereby the second signal (V2) branched in phase by means of the branch circuit (34) is inputted to the second and third differential amplifiers (35b, 35c), and thereby a linearly multiplied outputs of the first and second signals (V1, V2) can be led out from at least one of the first and second output ends (OUT1, OUT2).

With the above-described construction, according to short range radars and controlling method thereof of the present invention, a detector circuit multiplies signals obtained by branching received reflection wave signals by a branch circuit by means of a linear multiplier to obtain its square component, and samples a baseband component from its square component by means of a filter, thereby detecting a reflection wave signal. Thus, there is no need for a local signal for detection, and concurrently, its construction is simplified, making it possible to contribute to achievement of short range radars which are small in size and low in power consumption.

In addition, the short range radars and controlling method thereof of the present invention is a system of integrating power of received waves unlike a conventional correlating process, and thus, is suitable for detecting a target having a so-called large dispersion property in which a transmission pulse and a receiving pulse are greatly different from each other in waveform, such as a human body.

Further, according to the short range radars and controlling method thereof of the present invention, an oscillator for making an oscillating operation only during a period in which a pulse is inputted and outputting a short range wave as a transmission wave is used in a transmitter section, thereby preventing the generation of the residual carrier.

When a reflection wave signal is detected, there occurs a problem such as unstable characteristics due to a transient response when a local signal is intermittently generated, in the conventional quadrature detecting system. However, the present invention is directed to a square detecting system whose detecting characteristics does not basically depend on a transmission waveform, and can be applied smoothly without any problem when the above-described reflection wave signal is detected.

That is, according to short range radars and control method thereof of the present invention, as described above, a short pulse generating system and a square detecting system in which the residual carrier is not generated are combined with each other, thereby making it possible to contribute to achievement of short range radars suitable for detection of a target having a variety of scattering characteristics with a simple construction.

BRIEF DESCRIPTION OF DRAWINGS

FIG. 4 is a block diagram depicting another example of a transmitter for use in a transmitter section of the short range radars according to the first embodiment shown in FIG. 1;

FIG. 5A is a circuit schematic view depicting a basic type of a Gilbert mixer employed as an example of a linear multiplier of a detector circuit for use in a receiver section of the short range radars according to the first embodiment shown in FIG. 1;

FIG. 6 is a view showing a sine wave shaped signal S (t) inputted in a burst shape in phase to the Gilbert mixer and a square wave S (t)$^2$ and its envelope (baseband) W outputted from the Gilbert mixer for the purpose of a description of operation of the Gilbert mixer shown in FIGS. 5A and 5B;

FIG. 10 is a view showing a principal construction of a sample hold circuit for use in a receiver section of the short range radars according to the first embodiment shown in FIG. 1;

FIG. 12 is a block diagram depicting a construction of essential portions of a second embodiment of short range radars according to the present invention;

FIG. 13 is a block diagram depicting a construction of essential portions of a third embodiment of short range radars according to the present invention;

BEST MODE FOR CARRYING OUT THE INVENTION

Hereinafter, some embodiments of short range radars according to the present invention will be described with reference to the accompanying drawings.

First Embodiment

First a description will be given with respect to a construction of short range radars according to a first embodiment of the present invention.

Figure 1:
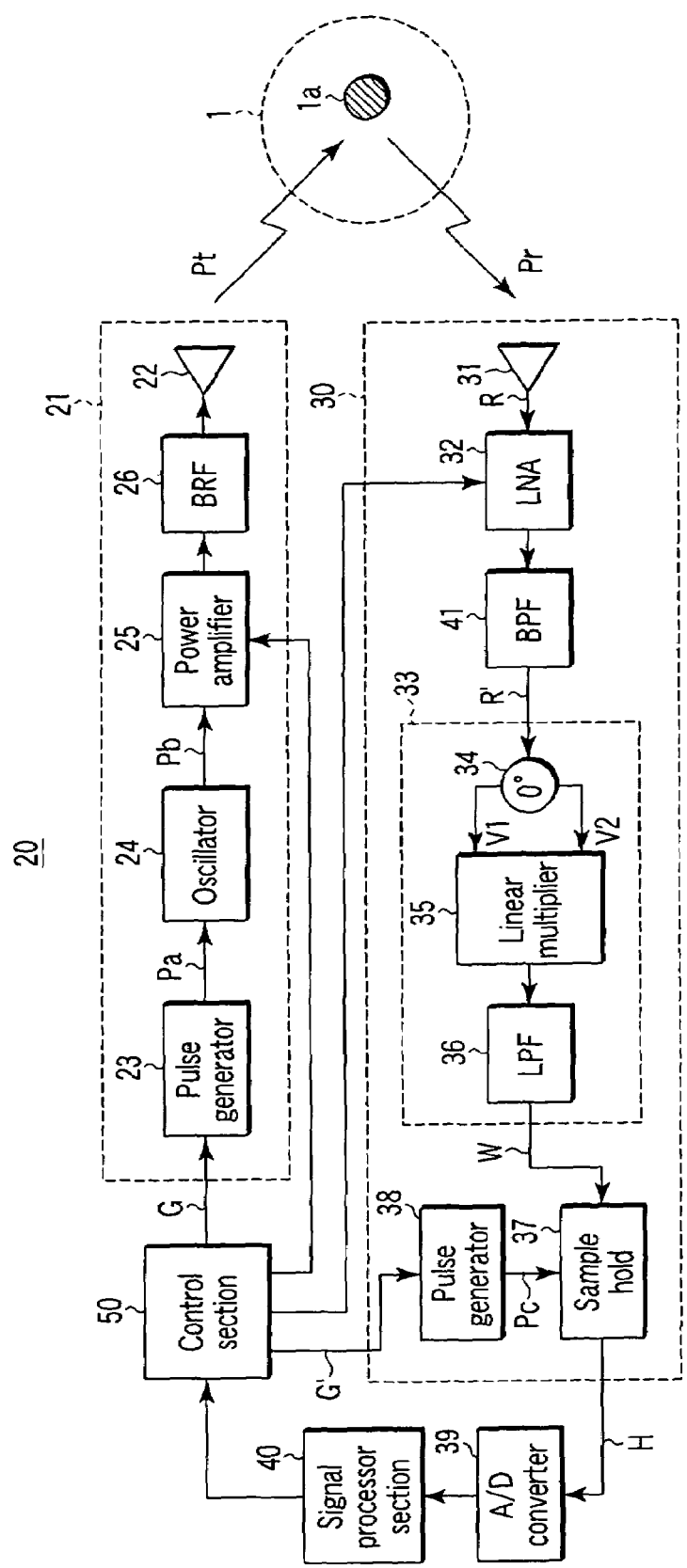
FIG. 1 is a block diagram depicting a system configuration of a first embodiment of short range radars according to the present invention.

FIG. 1 is a block diagram depicting a construction of a short range radar 20 according to the first embodiment of the present invention.

The short range radar 20 according to the present invention basically includes: a transmitter section 21 which radiates a short pulse Pt to a space 1; a receiver section 30 having a detector circuit 33 composed of a branch circuit 34 which receives a reflection wave Pr of a short range wave Pt radiated to the space 1 by means of this transmitter section 21 and branches in phase a signal R' of the reflection wave Pr into first and second signals V1 and V2, a linear multiplier 35 which linearly multiplies the first and second signals V1 and V2 branched in phase by means of this branch circuit 34, and a low pass filter 36 which samples a baseband component from an output signal from this linear multiplier 35; a signal processor section 40 which carries out an analyzing process of an object 1a which exists in the space 1 based on an output from this receiver section 30; and a control section 50 which makes predetermined control with respect to at least one of the transmitter section 21 and the receiver section 30 based on an analysis result from this signal processor section 40.

In addition, a method for controlling short range radars according to the present invention basically includes the steps of: preparing the transmitter section 21, the receiver section 30 and the linear multiplier 35; radiating the short range wave Pt to the space 1 by the transmitter section 21; receiving the reflection wave Pr of the short range wave Pt radiated to the space 1 by means of this receiver section 30 and branching in phase the signal R' of the reflection wave Pr into the first and second signals V1 and V2; linearly multiplying the first and second signals V1 and V2 by the linear multiplier 35 to output a linear multiplying signal; sampling a baseband component from this linear multiplied output signal; carrying out an analyzing process of the object 1a which exists in the space 1 based on this baseband component; and making predetermined control with respect to at least one of the transmitter section 21 and the receiver section 30 based on this analysis result.

Specifically, this short range radar 20 shown in FIG. 1 is composed of the transmitter section 21; the receiver section 30; an analog/digital (A/D) converter 30; the signal processor section 40; and the control section 50.

Every time the transmitter section 21 receives a trigger signal G outputted from the control section 50 at a predetermined cycle Tg, this transmitter section radiates to the space 1 via a transmitter antenna 22 a short range wave Pt having a predetermined carrier frequency Fc (for example, 26 GHz) at a predetermined bandwidth Tp (for example, 1 ns) generated as described later.

The transmitter antenna 22 may be shared with a receiver antenna 31 of the receiver section 30 described later.

This transmitter section 21, as shown in FIG. 1, has: a pulse generator 23 which generates a pulse signal Pa having a bandwidth Tp synchronized with a trigger signal G from the control section 50; an oscillator 24 which oscillates and outputs a signal having a predetermined carrier frequency Fc in a duration Tp in which a pulse signal Pa is received from this pulse generator 23; a power amplifier 25 which amplifies an output signal from this oscillator 24; a band rejection filter (BRF) 26 which suppresses a out-of-bandwidth unnecessary radiation in response to an output signal from this power amplifier 25; and the transmitter antenna 22 to which a signal having passed through this BRF 26 is supplied as a transmission wave.

Here, some configurations of the oscillator 24 are considered.

Figure 2:
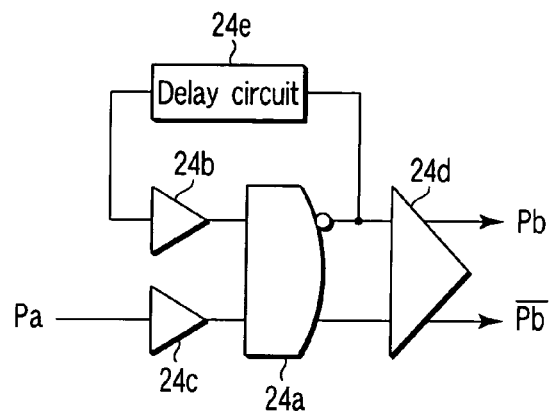
FIG. 2 is a block diagram depicting an example of a transmitter for use in a transmitter section of the short range radars according to the first embodiment shown in FIG. 1.

FIG. 2 is a block diagram depicting an example of a configuration of the oscillator 24 for use in the transmitter section 21 of the short range radars according to the first embodiment shown in FIG. 1.

That is, this oscillator 24, as shown in FIG. 2, has: a 2-input, 2-output type gate circuit 24a in which common input AND and NAND circuits are integrated with each other; first and second input buffers 24b and 24c of emitter follower type connected to an input section of this gate circuit 24a; and a delay circuit 24e which delays by a predetermined delay time inverted outputs of an output buffer 24d connected to an output section of the gate circuit 24a and the gate circuit 24a and inputs the delayed inverted outputs to the first input buffer 24b.

This delay circuit 24e is composed of a strip line or the like, for example.

Figure 3:
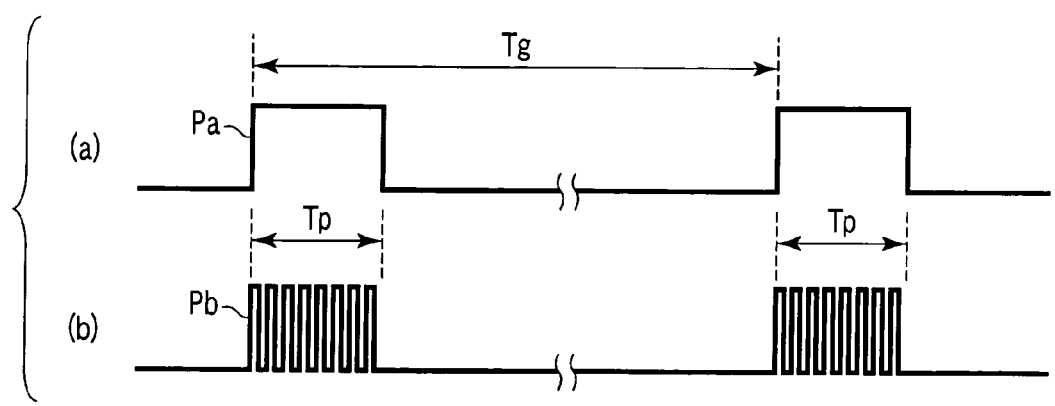
FIG. 3 is a view showing a pulse signal Pa of a cycle Tg inputted to a transmitter and a signal Pb formed in a rectangular shape outputted in a burst shape from the transmitter for the purpose of a description of operation of the transmitter shown in FIG. 2.

From the thus configured oscillator 24, as shown in FIG. 3A, while a pulse signal Pa having a cycle Tg is inputted to the input buffer 24c, as shown in FIG. 3B, a rectangular wave signal Pb having a predetermined frequency (carrier frequency) is oscillated and outputted in a burst shape.

A frequency of an output signal Pb from this oscillator 24 is determined depending on a total of a delay time between an input and an output of the input buffer 24b and the gate circuit 24a and a delay time of the delay circuit 24e.

Here, the delay time between an input and an output of the input buffer 24b and the gate circuit 24a is a fixed value generally determined depending on a circuit device.

Therefore, a construction is provided so as to vary some of the constants of the delay circuit 24e, and these constants are adjusted, and thereby an oscillation frequency of the output signal Pb of the oscillator 24 is set at a substantially center frequency (for example, 26 GHz) of the UWB.

FIG. 4 is a block diagram depicting another example of a configuration of the oscillator 24 for use in the transmitter section 21 of the short range radars according to the first embodiment shown in FIG. 1.

That is, the oscillator 24 according to this example of configuration, as shown in FIG. 4, has an amplifier 24f; a resonator 24g serving as a load of this amplifier 24f; and a feedback circuit 24h which positively feeds back an output of the amplifier 24f to an input side to form an oscillator circuit which operates to oscillate at a resonance frequency (for example, 26 GHz) of the resonator 24g.

Further, in this oscillator 24 according to this example of configuration, a switch 24i, the switching operation of which can be controlled by means of a pulse signal Pa, is provided between an input side (or output side) of the amplifier 24f and an earth line.

This oscillator 24 according to this example of configuration operates to oscillate when the switch 24i is opened in a duration in which a pulse signal Pa is inputted. In addition, in a duration in which no pulse signal Pa is inputted, the switch 24i is closed, and one end of a feedback loop is short-circuited in an earth line, and thereby an oscillation operation stops.

Here, a configuration is provided such that short-circuit and opening are established between an input side of the amplifier 24f and the earth line by means of the switch 24i.

Hence, a configuration may be provided such that short-circuit and opening are established between an output side of the amplifier 24f and the earth line by means of the switch 24i.

The transmitter section 21 using the oscillator 24 according to any of these configurations shown in FIGS. 2 and 4 is configured to control an oscillating operation itself of the oscillator 24 by means of a pulse signal Pa. Thus, no carrier leakage occurs in principle.

Therefore, when an UWB is used, limitation of power density regulated as described later may be considered only with respect to momentary power of a short range wave outputted at the time of oscillation. Thus, transmission wave power can be efficiently used to the maximum within a limit of power density regulated in accordance with a UWB standard concurrently because no carrier leakage occurs.

The above-described configurations of the oscillator 24 shown in FIGS. 2 and 4 each are provided as an example. With another circuit configuration, for example, by turning on and off power (current source or the like) of an oscillator circuit in response to a pulse signal Pa as well, a burst wave free of carrier leakage as described above can be obtained.

In order to obtain this burst wave, conventionally, there is used an amplification shift keying (ASK) system for pulse-modulating (ON/OFF) a 24 GHz carrier signal (continuous wave) by using a switch.

Hence, in such a conventional ASK system, isolation at the time of switching OFF is not complete, and a carrier leakage occurs. Moreover, in short range radars, an OFF time is overwhelmingly longer by several thousand times to several ten thousand times than ON time (for example 1 ns). Thus, even if a slight carrier leakage occurs, the large residual carrier power is generated as a whole.

This residual carrier limits substantial receiving sensitivity of a reflection wave with respect to a transmission wave of short range radars, thus narrowing a radar investigation range and making it difficult to detect an obstacle having a low reflection factor.

In addition, with respect to the UWB radar system, FCC (Federal Communication Committee) regulates in the following non-patent document 1 that average power density in a bandwidth of 22 GHz to 29 GHz be −41 dBm/MHz or less, and peak power density be 0 dBm/50 MHz or less.

Non-patent document 1 FCC02-08, New Part 15 Rules, "FIRST REPORT AND ORDER"

Namely, in the above-described UWB radar system, a total amount of energy in the bandwidth of 22 GHz to 29 GHz is regulated. Thus, if the residual carrier is large, an output level of a transmission wave must be set to be low concurrently, and an investigation distance or the like is greatly limited.

Figure 16:
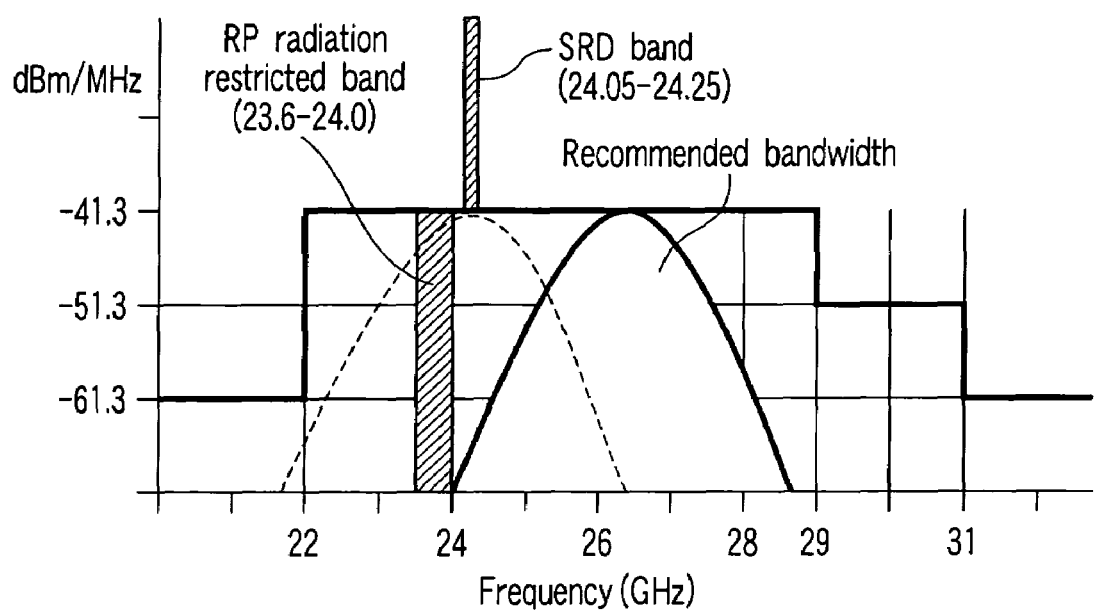
FIG. 16 is a view showing a spectrum mask of a quasi millimeter wave band UWB and a desired use frequency band (recommended bandwidth).

In order to solve this problem, as indicated by dashed line from an UWB recommended bandwidth indicated by solid line in FIG. 16, a center frequency of the transmission wave of short range radars is saved to a band having a narrow bandwidth (Short Range Device: SRD) from 24.05 GHz to 24.25 GHz allocated for Doppler radars, and thereby it is considered that regulations on the residual carrier by FCC can be avoided.

However, in this case, as shown in FIG. 16, there is a radiation restricted band by RR (International Radio Communication Rules) for protecting a passive sensor of EESS (Earth Survey Satellite) near SRD, and serious interference with this radiation restricted band is an interest of concern.

In contrast, in the present invention, as described above, a system of controlling ON/OFF an oscillating operation itself by means of a pulse signal Pa to principally prevent the generation of the residual carrier is employed as a configuration of the oscillator 24, and thereby a frequency of a radar transmission wave can be freely set within a recommended bandwidth of a spectrum mask regulated as shown in FIG. 16.

Moreover, in the present invention, the frequency of the transmission wave can be set so as to sufficiently avoid interference with the radiation restricted band as described above.

A signal Pb outputted from the oscillator 24 as described above is amplified by means of the power amplifier 25, and the amplified signal is supplied to the transmitter antenna 22 as a short range wave Pt having a predetermined carrier frequency Fc (for example, 26 GHz) via the BRF 26.

In this manner, from the transmitter antenna 22, the short range wave Pt is radiated to the space 1 targeted for investigation.

A gain of the power amplifier 25 can be variably controlled by means of the control section 50.

On the other hand, the receiver section 30 receives a reflection wave Pr from the object 1a of the space 1 via the receiving antenna 31; amplifies a signal R of the reflection Pr by means of an LNA (Low Noise Amplifier) 32; and then, detects by means of a detector circuit 33 a signal R' of the reflection wave Pr bandwidth-limited by means of a band pass filter (BPF) 41 having a bandwidth of about 2 GHz.

A gain of the LNA 32 can be variably controlled by means of the control section 50.

The detector circuit 33 is composed of: the branch circuit 34 which branches the signal R' of the reflection wave Pr outputted from the BRF 41 into the first signal V1 and the second signal V2 in phase (0 degree); the linear multiplier 35 which linearly multiplies the signals branched into two signals in that phase, i.e., the first signal V1 and the second signal V2; and a low pass filter (LPF) 36 which samples a baseband component W from an output signal of this linear multiplier 36.

The linear multiplier 35 includes some systems such as use of a double balancing mixer, and a method for configuring the multiplier by using a Gilbert mixer is considered as that which operates at a high speed.

This Gilbert mixer, as shown in FIG. 5A, basically consists of first to third differential amplifiers 35a, 35b, and 35c.

Then, the first signal V1 is differentially inputted to a first differential amplifier 35a and the second signal V2 is differentially inputted to second and third differential amplifiers 35b and 35c connected to a load side of this first differential amplifier 35a. In this manner, only a linearly multiplied signal component—(V1×V2) of an inverted phase equal to a product of the first signal V1 and the second signal V2 and a linearly multiplied signal component (V1×V2) of a positive phase are outputted from common load resistors R3 and R4 of the second and third differential amplifiers 35b and 35c.

Specifically, in this Gilbert mixer, the first differential amplifier 35a includes first and second transistors Q1 and Q2 each having a base input end, a collector output end, and an emitter common current path, wherein each of the base input ends of the first and second transistors Q1 and Q2 is connected to a first signal source V1 and the emitter common current path is connected to an earth line in series via a constant current source I1 and a first bias power source Vb1.

The emitter common current path of the first and second transistors Q1 and Q2 is lead out from a connection neutral point of emitter resistors R1 and R2 and a base input end of the second transistor Q2 is connected to an earth line via a second bias power source Vb2.

In addition, the second differential amplifier 35b includes third and fourth transistors Q3 and Q4 each having a base input end, a collector output end, and an emitter common current path, wherein each of the base input ends of the third and fourth transistors Q3 and Q4 is connected to a second signal source V2 and the emitter common current path of the third and fourth transistors Q3 and Q4 is connected to the collector output end of the first transistor Q1 of the first differential amplifier 35a.

In addition, the third differential amplifier 35a includes fifth and sixth transistors Q5 and Q6 each having a base input end, a collector output end, and an emitter common current path, wherein each of the base input ends of the fifth and sixth transistors Q5 and Q6 is connected to the second signal source V2 and the emitter common current path of the fifth and sixth transistors Q5 and Q6 is connected to the collector output end of the second transistor Q2 of the first differential amplifier 35a.

The base input end of each of the fourth transistor Q4 of the second differential amplifier 35b and the fifth transistor Q5 of the third differential amplifier 35c is connected in common, and is connected to an earth line via a third bias power source Vb3.

In addition, a collector output end of the third transistor Q3 of the second differential amplifier 35b and a collector output end of the fifth transistor Q5 of the third differential amplifier 35c are connected to an earth line via a load resistor R3 in common, and is connected to a first output end OUT1.

In addition, a collector output end of the fourth transistor Q4 of the second differential amplifier 35b and a collector output end of the sixth transistor Q6 of the third differential amplifier 35c are connected to an earth line via a load resistor R4 in common, and is connected to a second output end OUT2.

In this manner, at least one of the linearly multiplied outputs—(V1×V2) and (V1×V2) of the first and second signals V1 and V2 can be lead out from the first and second output ends OUT1 and OUT2.

As the first and second signals V1 and V2, when a sine wave shaped signal S (t) as shown in FIG. 6A, for example, is inputted to the thus configured linear multiplier 35 using the Gilbert mixer in a burst shape in phase, the output signal is produced as a waveform (S (t)$^2$) obtained by squaring the input signal S (t), as shown in FIG. 6B, and the envelope (baseband) W is proportional to power of the input signal S (t).

In this way, the linear multiplier 35 using the Gilbert mixer which consists of a plurality of differential amplifiers for use in the detector circuit 33 can be configured to be very small-sized with a microwave monolithic integrated circuit (MMC).

Moreover, there is no need for supplying a local signal unlike a conventional quadrature type detector circuit, and thus, power consumption is reduced concurrently.

In the meantime, the response characteristics of the linear multiplier 35 using the Gilbert mixer which has a basic circuit configuration as shown in FIG. 5A have a room to be improved for use in UWB.

Therefore, the inventors have improved its response characteristics by making improvement so as to carry out impedance matching or peaking correction and the like of an input/output section of a linear multiplier using the Gilbert mixer which has a basic circuit configuration as shown in FIG. 5A, and has achieved a linear multiplier which can be fully used in UWB.

Figure 5B:
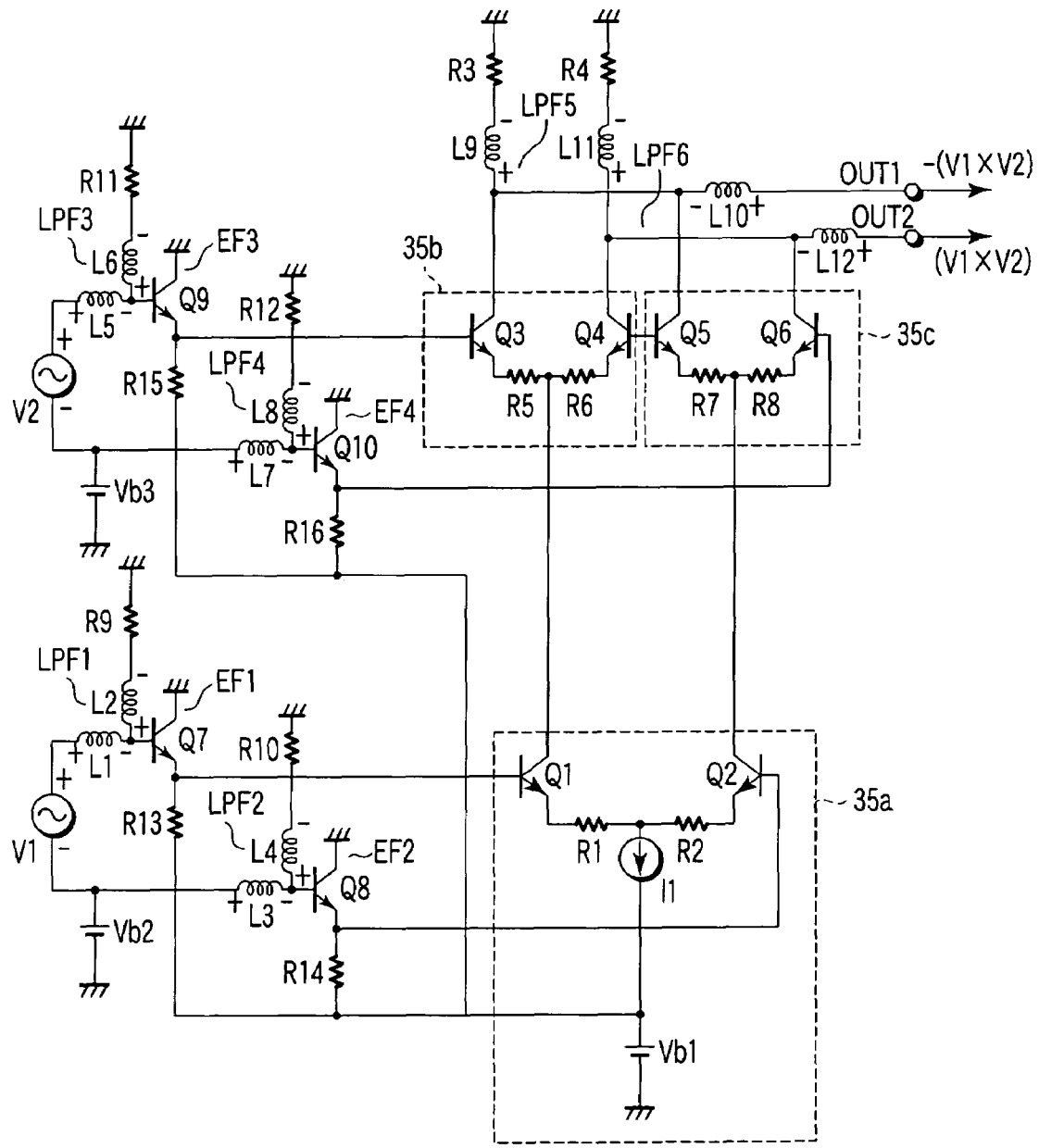
FIG. 5B is a circuit schematic view depicting an improved type of the Gilbert mixer shown in FIG. 5A.

FIG. 5B shows a circuit configuration of a Gilbert mixer of improved type achieved by the inventors.

In FIG. 5B, like constituent elements of the Gilbert mixer having a basic circuit configuration shown in FIG. 5A are designated by like reference numerals. A duplicate description is omitted here.

That is, as shown in FIG. 5B, in the Gilbert mixer of improved type, an emitter common current path of the third and fourth transistors Q3 and Q4 of the second differential amplifier 35b is lead out from a connection neutral point of the emitter resistors R5 and R6. In addition, the emitter common current path of the fifth and sixth transistors Q5 and Q6 of the third differential amplifier 35c is lead out from a connection neutral point of the emitter resistors R7 and R8.

Although use of these pairs of emitter resistors R5 and R6, and R7 and R8 is desirable in principle, as in the emitter resistors R1 and R2 of the first and second transistors Q1 and Q2 of the first to third differential amplifiers 35a, not so serious problem occurs in an actual circuit configuration even if they are eliminated.

In addition, in the Gilbert mixer of improved type as shown in FIG. 5B, first to fourth low pass filters LPF1, LPF2, LPF3, and LPF4 and first to forth emitter follower circuits EF1, EF2, EF3, and EF4 as described in the following specific configuration are provided at input sections of the first to third differential amplifiers 35a, 35b, and 35c.

In the Gilbert mixer of improved type as shown in FIG. 5B, fifth and sixth low pass filters LPF5 and LPF6 as described in the following specific configuration are provided at output sections of the second and third differential amplifiers 35b and 35c.

That is, according to the specific configuration of the Gilbert mixer of improved type as shown in FIG. 5B, the first low pass filter LPF1 including first and second coils L1 and L2 and a ninth resistor R9 connected in series and the second low pass filter LPF2 including third and fourth coils L3 and L4 and a tenth resistor R10 are provided, respectively, between a first pair of lines + and − for transmitting a first signal V1 branched in phase by means of the branch circuit 34 and an earth line.

In addition, in this Gilbert mixer of improved type, the third low pass filter LPF3 including fifth and sixth coils L5 and L6 and a eleventh resistor R11 connected in series and the fourth low pass filter LPF4 including seventh and eighth coils L7 and L8 and a twelfth resistor R12 are provided, respectively, between a second pair of lines + and − for transmitting a second signal V2 branched in phase by means of the branch circuit 34 and the earth line.

In addition, this Gilbert mixer of improved type includes seventh and eighth transistors Q7 and Q8 each having a base input end and an emitter output end. This mixer includes the first and second emitter follower circuits EF1 and EF2 in which each of the base input ends of the seventh and eighth transistors Q7 and Q8 is connected to each of the connecting neutral points of the first and second coils L1 and L2 and the third and fourth coils L3 and L4 as output ends of the first and second low pass filters LFP1 and LPF2.

In addition, this Gilbert mixer of improved type includes ninth and tenth transistors Q9 and Q10 each having a base input end and an emitter output end. This mixer includes third and fourth emitter follower circuits EF3 and EF4 in which each of the base input ends of the ninth and tenth transistors Q9 and Q10 is connected to each of the connecting neutral points of the fifth and sixth coils L5 and L6 and the seventh and eighth coils L7 and L8 as output ends of the third and fourth low pass filters LFP3 and LPF4.

From among the first and second pairs of lines + and − for transmitting the first and second signals V1 and V2, the second and third bias power sources Vb2 and Vb3 are connected between one line − and an earth line.

Here, in each of the emitters of the seventh and eighth transistors Q7 and Q8 and the ninth and tenth transistors Q9 and Q10, thirteenth to sixteenth resistors are connected at a connecting neutral point between the constant current source I1 and the bias power source Vb1, respectively.

In addition, each of the base input ends of the first and second transistors Q1 and Q2 of the first differential amplifier 35a is connected to each of the output ends of the first and second emitter follower circuits EF1 and EF2.

In addition, each of the base input ends of the third and sixth transistors Q1 and Q2 of the second and third differential amplifiers 35b and 35c is connected to each of the output ends of the third and fourth emitter follower circuits EF3 and EF4.

In addition, a collector output end of the third transistor Q3 of the second differential amplifier 35b and a collector output end of the fifth transistor Q5 of the third differential amplifier 35c are connected in common to a load resistor R3 via the ninth coil L9, and are connected to the first output end OUT1 via the tenth coil L10.

Here, the ninth coil L9, the load resistor R3, and the tenth coil L10 configure a fifth low pass filter LPF5.

In addition, a collector output end of the fourth transistor Q4 of the second differential amplifier 35b and a collector output end of the sixth transistor Q6 of the third differential amplifier 35c are connected to an earth line via an eleventh coil L11 in common and via a load resistor R4, and are connected to the second output end OUT2 via a twelfth coil L12.

Here, the eleventh coil L11, the load resistor R4, and the twelfth coil L12 configure the sixth low pass filter LPF6.

In this manner, at least one of the linearly multiplied output —(V1×V2) and (V1×V2) of the first and second signals V1 and V2 can be lead out from the first and second output ends OUT1 and OUT2.

That is, a sine wave shaped signal S (t) as shown in FIG. 6A, for example, is inputted in a burst shape in phase as first and second signals V1 and V2 to the thus configured improved linear multiplier 35 using the Gilbert mixer shown in FIG. 5B, its output signal is produced as a waveform (S (t)$^2$) obtained by squaring an input signal S (t), as shown in FIG. 6B. Its envelope (baseband) W is proportional to power of the input signal S (t) as is the case with the basic linear multiplier 35 using the Gilbert mixer shown in FIG. 5A.

In addition, the linear multiplier 35 using the Gilbert mixer shown in FIG. 5B improved for use in the detector circuit 33 can be configured to be very small sized with a microwave monolithic integrated circuit (MMC). Moreover, there is no need for supplying a local signal unlike a conventional quadrature type detector circuit, and thus, power consumption is reduced concurrently, as is the case with the basic linear multiplier 35 using the Gilbert mixer shown in FIG. 5A.

Hence, in the improved Gilbert mixer shown in FIG. 5B configured as described above, the first to fourth low pass filters LPF1, LPF2, LPF3, and LPF4 and the first to fourth emitter follower circuits EF1, EF2, EF3, and EF4 each having high Q are provided at input sections of the first to third differential amplifiers 35a, 35b, and 35c. In this manner, input impedance is enhanced, and a peaking effect is attained.

In addition, in the Gilbert mixer of improved type as shown in FIG. 5B, the fifth and sixth low pass filters LPF5 and LPF6 are provided at output sections of the second and third differential amplifiers 35b and 35c, and thereby a peaking effect is attained.

In this manner, the Gilbert mixer of improved type as shown in FIG. 5B is improved so as to enable impedance matching or peaking correction and the like at an input/output section of the linear multiplier 35 using the Gilbert mixer having a basic circuit configuration as shown in FIG. 5A. Thus, its response characteristics are effectively improved, and the improved linear multiplier 35 using the Gilbert mixer which can be fully used in UWB can be provided.

Figure 7:
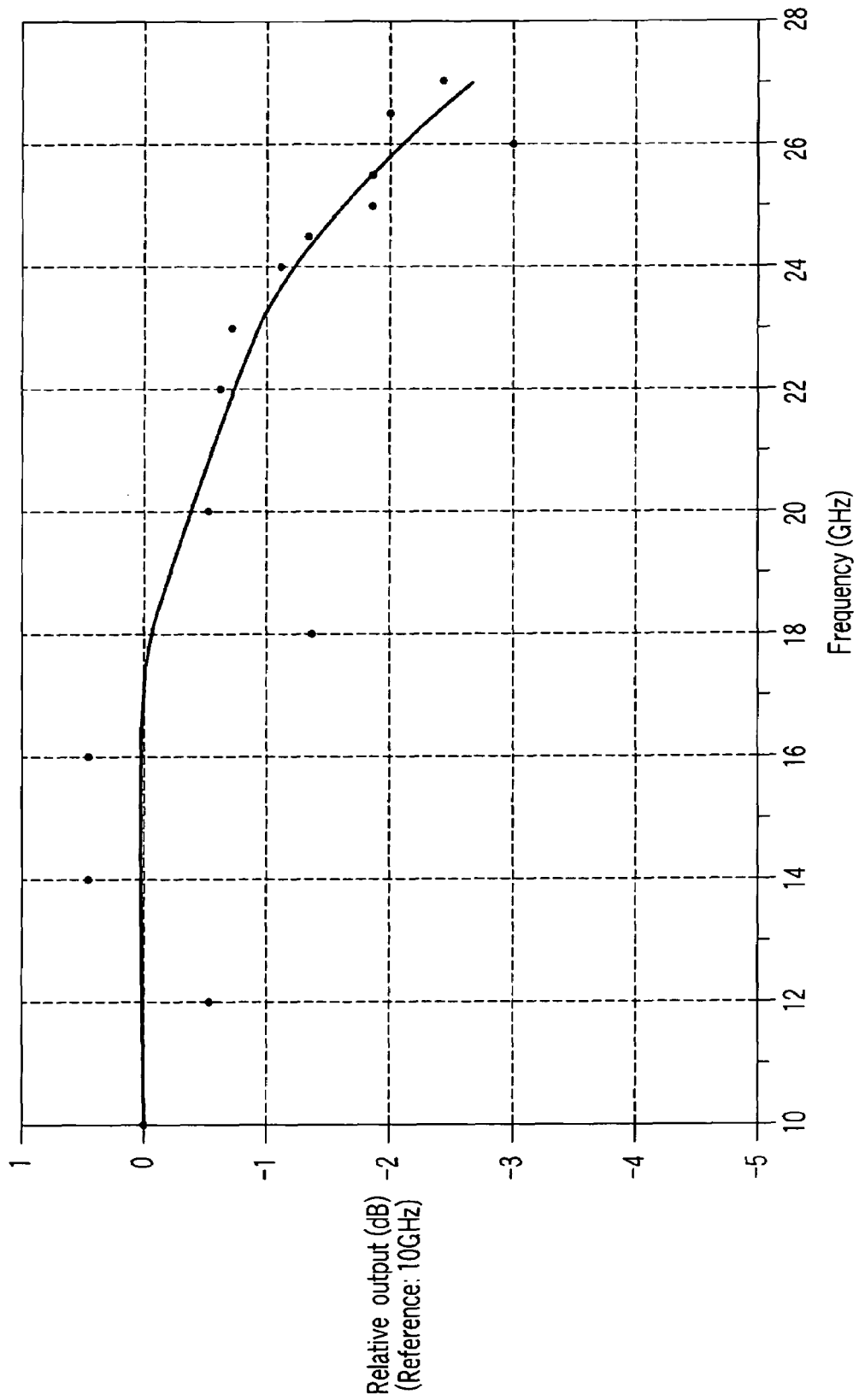
FIG. 7 is a view showing a measurement result of frequency characteristics of a linear multiplier in the case where the Gilbert mixer shown in FIG. 5B is employed.

FIG. 7 shows a measurement result of frequency characteristics of the linear multiplier 35 using the Gilbert mixer of improved type shown in FIG. 5B.

That is, according to the measurement result of the frequency characteristics of the linear multiplier 35 using the Gilbert mixer of improved type shown in FIG. 7, a bandwidth within −3 dB extends to about 27 GHz, and it is determined that sufficient adaptability be provided to short range radars whose UWB center is a carrier frequency (for example, 26 GHz).

Figure 8:
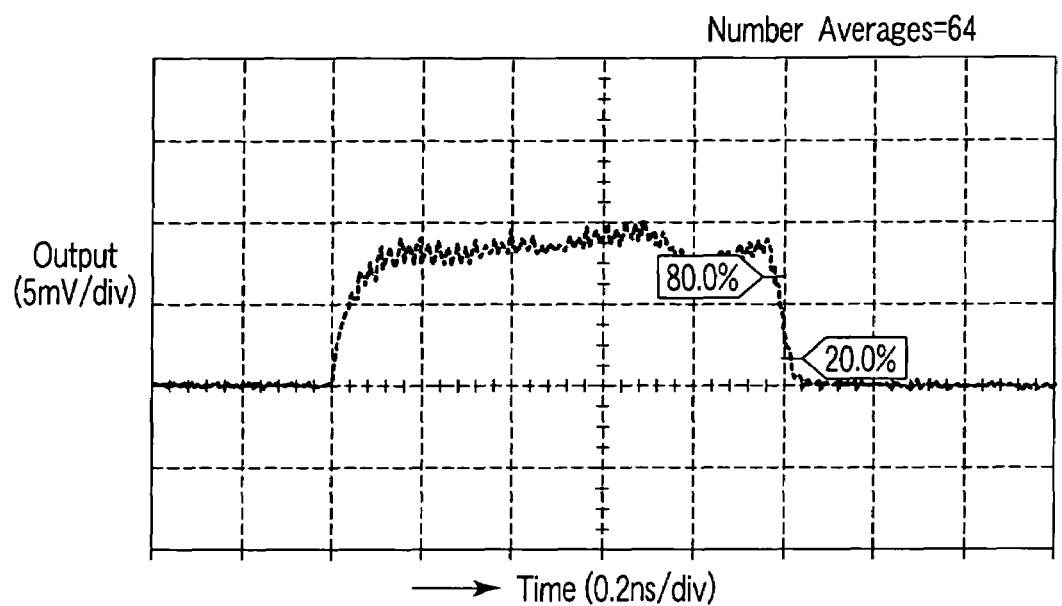
FIG. 8 is a view showing an observed waveform of a baseband component W obtained when an output of the linear multiplier in response to an input signal of a pulse width 1 ns in the case where the Gilbert mixer shown in FIG. 5B is employed is subjected to a 7 GHz bandwidth limitation by means of a low pass filter.

FIG. 8 shows a waveform (averaging number 64) in the case of observing by means of an observation oscilloscope a baseband component W obtained by applying 7 GHz bandwidth limitation to an output relevant to an input signal having a pulse width 1 ns of the linear multiplier 35 using the Gilbert mixer of improved type as shown in FIG. 5B by means of a low pass filter 36.

That is, according to the observation waveform shown in FIG. 8, an average rise time obtained by a computing function of the observation oscilloscope is set to about 59 ps, and an average fall time is set to about 36 ps (a fall time from 80% to 20%), and it is found that extremely high speed response characteristics are provided.

Figure 9:
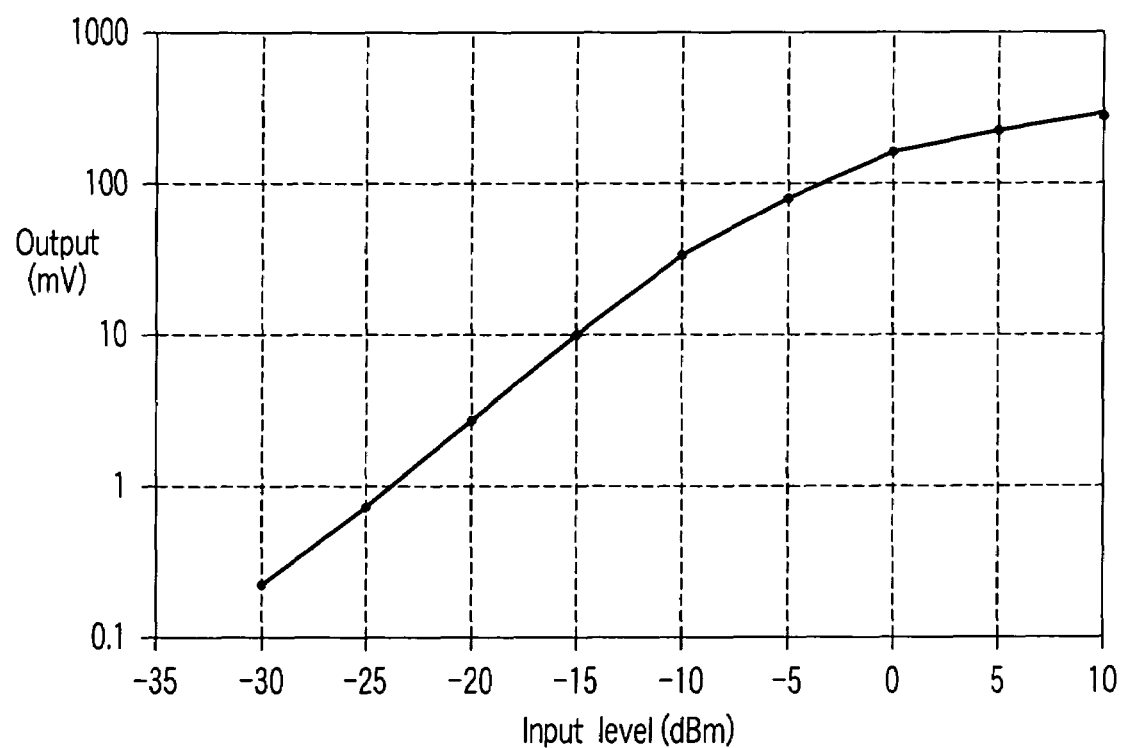
FIG. 9 is a view showing a measurement result of input and output characteristics of the linear multiplier in the case where the Gilbert mixer shown in FIG. 5B is employed.

FIG. 9 shows a measurement result of input/output characteristics of the linear multiplier 35 using the Gilbert mixer of improved type as shown in FIG. 5B.

That is, according to a measurement result shown in FIG. 9, it is found that good linearity is obtained in a wide range from −30 dBm to −5 dBm in input level.

Therefore, the level of an input signal (V1, V2) is controlled in the range from −30 dBm to −5 dBm, and thereby an output of the improved linear multiplier 35 using the Gilbert mixer shown in FIG. 5B precisely indicates power of the input signal.

In addition, a baseband signal W obtained by means of the detector circuit 33 as described above is inputted to a sample hold circuit 37.

The sample hold circuit 37, as its principle is shown in FIG. 10, has a configuration for inputting a baseband signal W via a switch 37c to an integrator circuit using a resistor 37a and a capacitor 37b.

While a pulse signal Pc from a pulse generator 38 is at a high level (may be at a low level), the switch 37c is closed, and the baseband signal W is integrated. When the pulse signal Pc is at a low level, the switch 37c is opened, and an integration result is held by means of the capacitor 37b.

While a description is given assuming that a sampling cycle of the sample hold circuit 37, i.e., a cycle of the pulse signal Pc, is equal to that of a trigger signal G, the sampling cycle may be an integer multiple of a cycle Tg of the trigger signal G.

The pulse generator 38 receives a signal G' synchronized with the trigger signal G (or trigger signal G itself), and delays by a time interval Td specified by the control section 50 in response to the signal G. In addition, this pulse generator generates a pulse signal Pc having a width Tc specified by the control section 50 and outputs the generated signal to the sample hold circuit 37.

A signal H held after integrated by the sample hold circuit 37 is converted into a digital value by means of an A/D converter 39 immediately after being held, and the converted digital value is inputted to the signal processor section 40.

The signal processor section 40 analyzes the object 1a which exists in the space 1 based on a signal H obtained at the receiver section 30; broadcasts its analysis result by an output device, although not shown (for example, display and voice generator); and notifies information required for control to the control section 50.

The control section 50 makes a variety of predetermined controls with respect to at least one of the transmitter section 21 and the receiver section 30 in accordance with a schedule (program) predetermined with respect to this short range radar 20 or in response to a processing result of the signal processor section 40.

Now, one example of operation of this short range radar 20 will be described here.

The control section 50 sets a gain of the power amplifier 25 to a predetermined value in initial setting of an investigating operation by this short range radar 20; sets a gain of the LNA32 at a maximum, for example; and supplies a trigger signal G having a cycle Tg (for example, 10 μs) to the pulse generator 23 of the transmitter section 21.

Figure 11:
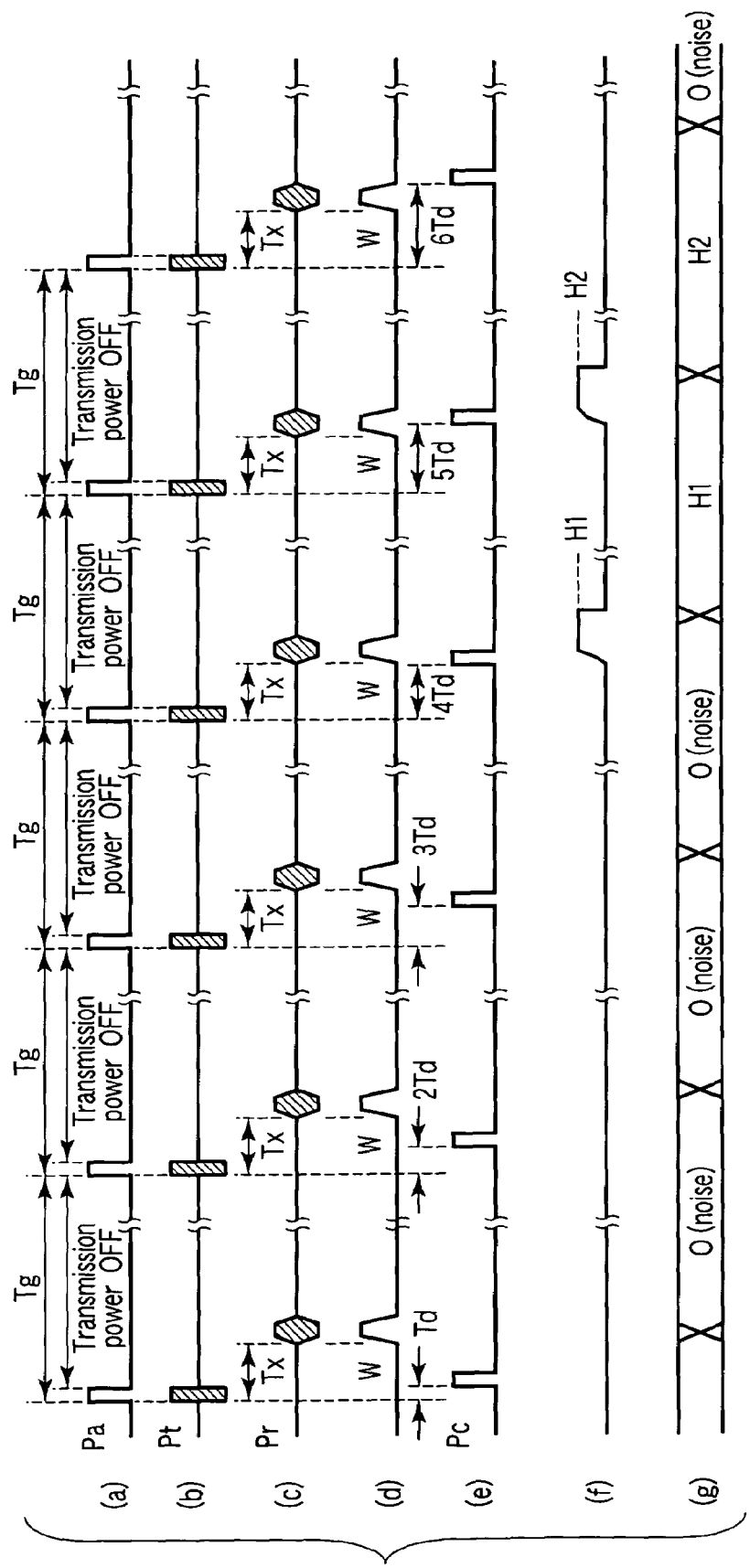
FIG. 11 is a timing chart adopted to explain an operation of the short range radars according to the first embodiment shown in FIG. 1.
Figure 14:
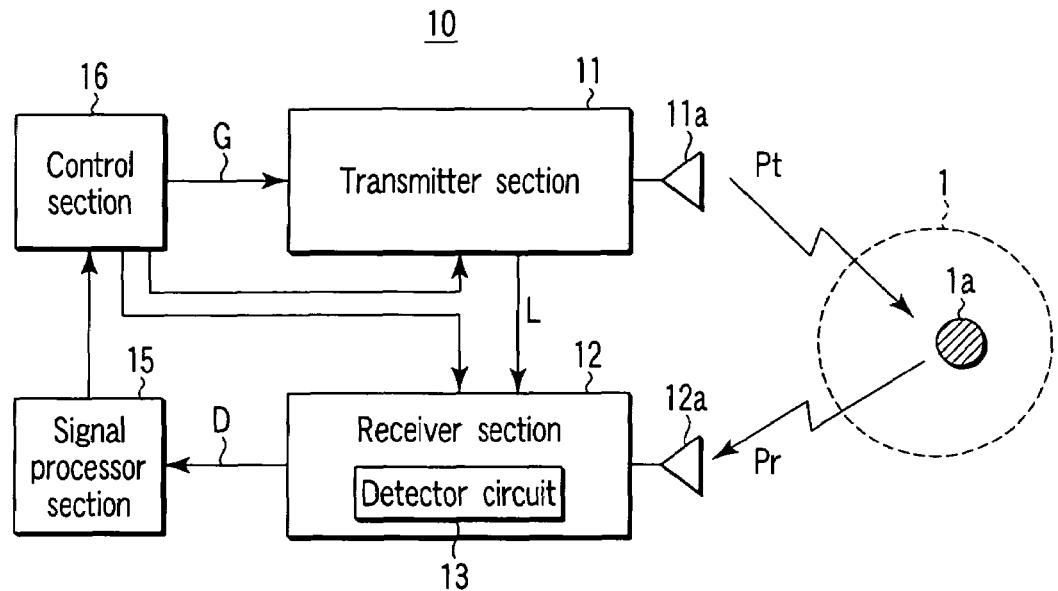
FIG. 14 is a block diagram depicting a basic construction of conventional pulse radars.
Figure 15:
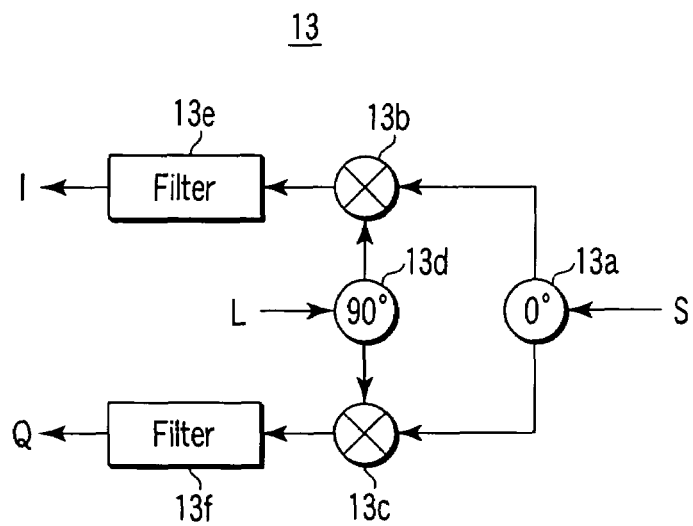
FIG. 15 is a block diagram depicting a basic construction of a quadrature type detector circuit for use in the conventional pulse radars shown in FIG. 14.

In this manner, when a pulse signal Pa having a width Tp (for example, 1 ns) as shown in FIG. 11A is inputted to the oscillator 24 of the transmitter section 21, the transmitter section 21 radiates a short range wave Pt having a width Tp to the space 1 at a carrier frequency Fc (for example, 26 GHz) as shown in FIG. 11B from the transmitter antenna 22 via the power amplifier 25 and BRF 26.

At this time, power supply to the transmitter section 21 is provided to only an output period of the short range wave Pt (or very limited period including the output period) by means of the control section 50.

In this manner, a time interval at which power is supplied to the transmitter section 21 is substantially 1/10000 of the whole cycle Tg, and thus, wasteful power consumption does not occur.

The short range wave Pt radiated from the transmitter section 21 is reflected by the object 1a which exists in the space 1, and the reflection wave Pr is received by means of the receiver antenna 31 of the receiver section 30 after being delayed by a time interval Tx corresponding to a reciprocal distance from a transmission timing of each short range wave Pt to the object 1a, as shown in FIG. 11C, for example.

In the receiver section 30, after the signal R of the thus received reflection wave Pr has been amplified by means of the LNA32, the amplified signal is subjected to bandwidth limitation by means of the BPF 41, and noise power is reduced. In addition, after the signal R' of the reflection wave Pr outputted from the BPF 41 has been branched into two sections, the first signal V1 and second signal V2 in phase by means of the branch circuit 34 of the detector circuit 33, the branched signals are detected by means of the linear multiplier 35 and the low pass filter 36, thereby detecting a baseband component W as shown in FIG. 11D.

On the other hand, in the sample hold circuit 37, a pulse signal Pc having a width (for example, 1 ns) as shown in FIG. 11E is inputted to be delayed by Td, 2Td, 3Td, . . . and nTd (n is an integer) from each transmission timing of the short range wave Pt.

Here, a description will be given with respect to a case in which the delay time Td is equal to a width of the pulse Pc.

In addition, assuming that a distance up to a distal end of the space 1 targeted for investigation is within 15 m, a time for a radio wave to reciprocate the distance of 15 m is substantially 100 ns.

Therefore, by delaying a transmission timing of a short range wave Pt by a maximum of 100 Td, as long as the reflection waves Pr is within the range of 15 m, these reflection waves Pr can be fully included in coverage.

As shown in FIGS. 11C, 11D, and 11E, the first to third pulse signals Pc do not overlap a baseband component W, and thus, the sample hold circuit 37 integrates only a noise component, and its integration result and hold value are substantially zero.

When fourth and fifth pulse signals Pc overlap a baseband component W, as shown in FIG. 11F, the baseband signal W is integrated within a high level period of the pulse signals Pc, and the integration results H1 and H2 are held. In this manner, the hold values H1 and H2 are converted into digital values by means of the A/D converter 39, and the converted digital values are outputted to the signal processor section 40 in a manner as shown in FIG. 11G.

The signal processor section 40 detects a distance up to the object 1a and the object size based on these hold values H1 and H2.

That is, when a hold value H equal to or greater than a predetermined level has been inputted, for example, the signal processor section 40 detects a distance up to the object 1a according to how many samplings have been performed before the input is obtained.

In addition, in the case where a hold value H equal to or greater than a predetermined level is continuous, the signal processor section 40 detects the size of the object 1a according to its continuous number.

This detection information is notified to the control section 50.

When the detection information notified from the signal processor section 40 indicates that a distance up to the object 1a is short, and the intensity of the reflection wave Pr is high, the control section 50 reduces a gain of the LNA2 of the receiver section 30 so that an input level of the detector circuit 33 is within the range of linear operation of the linear multiplier 35.

In this case, the control section 50 controls a gain of the power amplifier 25 of the transmitter section 21 to be reduced if necessary.

In this manner, during next investigation, a more precise baseband component W is detected in the detector circuit 33 of the receiver 30.

In addition, in the case where the detection information notified from the signal processor section 40 indicates that there is a need for analyzing a weak reflection wave Pr from the vicinity of a distal end of an investigation space 1, the control section 50 controls a gain of the power amplifier 25 of the transmitter section 21 to be increased.

In this manner, during next investigation, a more precise baseband component W is detected in the detector circuit 33 of the receiver section 30.

In addition, the control section 50 makes control so as to obtain necessary investigation information by appropriately varying the integration time Tc of the sample hold circuit 37 according to the state of the investigation space 1, the size of the object 1a and the like.

In this case, although the control section 50 makes control for stopping power supply excluding only a period in which a short range wave Pt is radiated with respect to the transmitter section 21, this control section does not make such control with respect to the receiver section 30 at all.

Hence, as described previously, in the case where a time interval corresponding to the investigation range is 100 ns, and the radiation cycle Tg of the short range wave Pt is 10 µs, in fact, only about 1/100 in that cycle Tg is utilized.

Therefore, during the remaining period (that is, about 99/100 in the cycle Tg), power supply to the receiver section 30 is stopped by the control section 50, and thereby power consumption can be further reduced.

In addition, for example, in the case where a hold output H equal to or greater than a predetermined level cannot be obtained by radiation of 100 short range waves Pt, the signal processor section 40 judges that no object becomes an obstacle in the investigation range, and notifies the fact to the control section 50.

The control section 50 having received this notification stops power supply to the transmitter section 21 and the receiver section 30 for a predetermined period (for example, 1 ms); restarts power supply after elapse of the predetermined time; and makes control for repeating the investigating operation as described above.

Power consumption of the whole short range radars can be remarkably reduced and battery can be driven by controlling power supply to the transmitter section 21 and the receiver section 30 by means of the control section 50.

In this manner, it becomes possible to provide portable short range radars.

In the foregoing description, in the sample hold circuit 37, investigation is made while a integration timing is shifted in a short integration time.

Hence, for example, at the initial stage of investigation, an integration time is set at a time interval (for example, 100 ns) corresponding to an investigation distance (that is, is set to a full range), thereby making it possible to speedily grasp the presence or absence of an object by one short pulse radiation.

Second Embodiment

FIG. 12 is a block diagram depicting a configuration of essential portions of a second embodiment of short range radars according to the present invention.

As described above, in the integration type sample hold circuit 37 according to the first embodiment, an electric discharge due to a leakage occurs, thus making it difficult to hold a voltage for a long period of time.

In such a case, as shown in FIG. 12, a plurality of sample hold circuits, in this example, four sample hold circuits 37A, 37B, 37C, and 37D and four A/D converters 39A, 39B, 39C, and 39D are provided in parallel.

In addition, for example, Pc (t), Pc (t+Te/4), Pc (t+Te/2), and Pc (t+3Te/4) may be applied from a pulse generator 38' as a plurality of pulse signals whose generation times are different from each other so that the sample hold circuits 37A, 37B, 37C, and 37D each carry out integration at their respectively different periods with respect to an output signal W of the detector circuit 33.

Namely, with respect to the above example of numeric values, the whole integration time Te is 100 ns, and the pulse generator 38' provides four pulse signals Pc (t), Pc (t+25 ns), Pc (t+50 ns), and Pc (t+75 ns) whose width is 25 ns (=Te/4) and each of which is delayed by 25 ns (=Te/4) to each of the sample holds circuits 37A, 37B, 37C, and 37D.

Then, hold values Ha, Hb, Hc, and Hd from the sample hold circuits 37A, 37B, 37C, and 37D may be outputted to the signal processor section 40 after converted into digital values by means of the A/D converters 39A, 39B, 39C, and 39D, respectively.

In this case, the signal processor section 40 analyzes whether or not an object 1a exists in an investigation space 1 based on at least one of the four hold values Ha, Hb, Hc, and Hd from the sample hold circuits 37A, 37B, 37C, and 37D.

Even if the first three hold values Ha, Hb, and Hc cannot be discriminated from among the four hold values Ha, Hb, Hc, and Hd due to electric discharge caused by a leakage, during this analysis, the signal processor section 40 can analyze whether or not the object 1a exists in the investigating space 1 based on the immediately following fourth hold value Hd.

Third Embodiment

FIG. 13 is a block diagram depicting a configuration of essential portions of a third embodiment of short range radars according to the present invention.

In FIG. 13, the same constituent elements having a configuration of short range radars according to the first embodiment shown in FIG. 1 are designated by the same reference numerals. A duplicate description is omitted here.

As described above, in the short range radars according to the present invention, a linear multiplier 35 is used for a detector circuit 33, and thereby there is no need for using a local signal unlike a conventional quadrature type detector circuit for use in pulse radars. Thus, a short pulse radar 20' in a diversity system as shown in FIG. 13 can be provided very easily.

In this short pulse radar 20', two pairs of receiver sections 30A and 30B and two pairs of A/D converters 39A and 39B allocated in a state in which respective receiving antennas 31a and 31b are spaced from each other by a predetermined distance are provided with respect to one transmitter section 21, one signal processor section 40, and one control section 50.

Then, with respect to signals of two reflection waves Pr and Pr' reflected in different directions from an object 1a, the receiver sections 30A and 30B each apply an detecting process using a linear multiplier 35 and an integrating process using a sample hold circuit 37 in the same manner as in the receiver section 30 according to the first embodiment shown in FIG. 1. In addition, these two outputs Ha and Hb are converted into digital signals by means of each of the A/D converters 39A and 39B, and then, a delay time difference between the two reflection waves Pr and Pr' is detected by means of the signal processor section 40, thereby making it possible to grasp a direction, a moving direction and the like of the object 1a.

Thus, even in the case where a plurality of receiver sections 30A, 30A are provided, there is no need for local signal cable run or shielding like the receiver section 30 according to the first embodiment shown in FIG. 1. In addition, detection can be carried out by means of the detector circuit 33 which includes independent linear multipliers 35, respectively, and thus, equipment designing of short range radars becomes very easy.

Therefore, as described above, according to the present invention, there can be provided short range radars and control method thereof which solve the problems associated with the conventional technique, and which is small in size and low in power consumption so as to be available in UWB.

The invention claimed is:

1. A short range radar comprising:
    a transmitter section which radiates a short range wave to a space;
    a receiver section having a detector circuit composed of a branch circuit which receives a reflection wave of the short range wave radiated to the space by means of the transmitter section and branches in phase a signal of the reflection wave into first and second signals, a linear multiplier which linearly multiplies the first and second signals branched in phase by means of the branch circuit, and a low pass filter which samples a baseband component from an output signal from the linear multiplier;
    a signal processor section which carries out an analyzing process of an object which exists in the space based on an output from the receiver section; and
    a control section which makes a predetermined control with respect to at least one of the transmitter section and the receiver section based on an analysis result from the signal processor section.

2. The short range radar according to claim 1, characterized in that the linear multiplier of the detector circuit is composed of a Gilbert mixer.

3. The short range radar according to claim 1, characterized in that the receiver section has a sample hold circuit which carries out integration with respect to an output signal of the detector circuit and holds and outputs a result of the integration.

4. The short range radar according to claim 3, characterized in that the control section variably controls an integration start timing and an integration time of the sample hold circuit of the receiver section based on a processing result from the signal processor section.

5. The short range radar according to claim 3, characterized in that a plurality of sample hold circuits are provided as the sample hold circuit, and the plurality of sample hold circuits each carry out integration in different periods from each other with respect to the output signal from the detector circuit.

6. The short range radar according to claim 1, characterized in that
    a power amplifier which amplifies the short range wave is provided at the transmitter section,
    a low noise amplifier which amplifies a signal of the reflection wave is provided at the receiver section, and
    the control section controls a gain of at least one of the power amplifier provided at the transmitter section and the low noise amplifier provided at the receiver section so that a signal level of the reflection wave inputted to the detector circuit of the receiver section is within a linear operation range of the linear multiplier.

7. The short range radar according to claim 1, characterized in that the transmitter section is provided with: a pulse generator which generates a pulse signal having a predetermined width; and an oscillator which operates to oscillate only in a period in which the pulse signal from the pulse generator is inputted and outputs an output signal as the short range wave, and stops the oscillating operation in a period in which the pulse signal is not inputted.

8. The short range radar according to claim 1, characterized in that the control section stops power supply to the transmitter section in a period in which the transmitter section radiates the short range wave to the space, and radiates a next short range wave to the space.

9. The short range radar according to claim 1, characterized in that the control section stops power supply to the receiver section in a period in which the transmitter section radiates the short range wave to the space, and then, radiates a next short range wave to the space except a period in which a signal of a reflection wave relevant to the short range wave radiated to the space is received by means of the receiver section.

10. The short range radar according to claim 1, characterized in that first and second receiver sections are provided as the receiver section, each of which has first and second receiving antennas provided to be spaced from each other with a predetermined distance in order to receive the reflection wave, and
    the signal processor section analyzes a direction of an object which exists in the space based on output signals from the first and second receiver sections.

11. The short range radar according to claim 2, characterized in that the Gilbert mixer used as the linear multiplier of the detector circuit comprises:
    a first differential amplifier comprising first and second transistors each having a base input end, a collector output end, and an emitter common current path, the emitter common current path of the first and second transistors being connected to a constant current source;
    a second differential amplifier comprising third and fourth transistors each having a base input end, a collector output end, and an emitter common current path, the emitter common current path of the third and fourth transistors being connected to a collector output end of the first transistor of the first differential amplifier;
    a third differential amplifier comprising fifth and sixth transistors each having a base input end, a collector output end, and an emitter common current path, the base input end of the fifth transistor being connected in common to the base input end of the fourth transistor of the second differential amplifier, the emitter common current path of the fifth and sixth transistors being connected to a collector output end of the second transistor of the first differential amplifier;
    a first load resistor and a first output end connected in common to a collector output end of the third transistor of the second differential amplifier and a collector output end of the fifth transistor of the third differential amplifier, respectively;
    a second load resistor and a second output end connected in common to a collector output end of the fourth transistor of the second differential amplifier and a collector output end of the sixth transistor of the third differential amplifier, respectively;
    a first low pass filter including first and second coils and a first resistor and a second low pass filter including third and fourth coils and a second resistor connected in series, respectively, between a first pair of lines and an earth line which transmits the first signal branched in phase by means of the branch circuit;
    a third low pass filter including fifth and sixth coils and a third resistor and a fourth low pass filter including seventh and eighth coils and a fourth resistor connected in series, respectively, between a second pair of lines and an earth line which transmits the second signal branched in phase by means of the branch circuit;

first and second emitter follower circuits comprising seventh and eighth transistors each having a base input end and an emitter output end, the base input ends of the seventh and eighth transistors each being connected to each of connecting neutral points of the first and second coils and the third and fourth coils as each of the output ends of the first and second low pass filters;

third and fourth emitter follower circuits comprising ninth and tenth transistors each having a base input end and an emitter output end, the base input ends of the ninth and tenth transistors each being connected to each of connecting neutral points of the fifth and sixth coils and the seventh and eighth coils as each of the output ends of the third and fourth low pass filters;

a fifth low pass filter composed of: a ninth coil connected between a common collector output end of the third transistor of the second differential amplifier and the fifth transistor of the third differential amplifier and the first load resistor; a tenth coil connected between the common collector output end of the third transistor of the second differential amplifier and the fifth transistor of the third differential amplifier and the first output end; and the first load resistor; and a sixth low pass filter composed of: an eleventh coil connected between a common collector output end of the fourth transistor of the second differential amplifier and the sixth transistor of the third differential amplifier and the second load resistor; a twelfth coil connected between a common collector output end of the fourth transistor of the second differential amplifier and the sixth transistor of the third differential amplifier and the second output end; and the second load resistor, wherein each of the base input ends of the first and second transistors of the first differential amplifier is connected to each of the output ends of the first and second emitter follower circuits, respectively, and thereby the first signal branched in phase by means of the branch circuit is inputted to the first differential amplifier; and each of the base input ends of the third transistor of the second differential amplifier and the sixth transistor of the third differential amplifier is connected to each of the output ends of the third and fourth emitter follower circuits, respectively, and thereby the second signal branched in phase by means of the branch circuit is inputted to the second and third differential amplifiers, and thereby a linearly multiplied outputs of the first and second signals can be led out from at least one of the first and second output ends.

12. A short range radar controlling method comprising the steps of:

preparing a transmitter section, a receiver section, and a linear multiplier;

radiating a short range wave to a space by means of the transmitter section;

receiving a reflection wave of the short range wave radiated to the space by means of the receiver section to branch in phase a signal of the reflection wave into first and second signals;

linearly multiplying the first and second signals by means of the linear multiplier to output a linearly multiplied signal;

sampling a baseband component from an output signal of the linear multiplier;

carrying out an analyzing process of an object which exists in the space based on the baseband component; and making a predetermined control with respect to at least one of the transmitter section and the receiver section based on a result of the analyzing process.

13. The short range radar controlling method according to claim 12, characterized in that the step of outputting the linearly multiplied signal comprises the step of carrying out linear multiplication for outputting the linearly multiplied signal by using a Gilbert mixer as the linear multiplier.

14. The short range radar controlling method according to claim 12, characterized by further comprising the step of, before the step of carrying out the analyzing process, carrying out integration with respect to the baseband component and holding and outputting a result of the integration.

15. The short range radar controlling method according to claim 14, characterized in that the step of carrying out integration with respect to the baseband component comprises the step of variably controlling a start timing of integration and an integration time with respect to the baseband component based on the result of the analyzing process.

16. The short range radar controlling method according to claim 14, characterized in that the step of carrying out integration with respect to the baseband component comprises the step of carrying out integration in a plurality of periods different from each other with respect to the baseband component by using a plurality of sample hold circuits.

17. The short range radar controlling method according to claim 12, characterized in that a power amplifier which amplifies the short range wave is provided at the transmitter section, a low noise amplifier which amplifies a signal of the reflection wave is provided at the receiver section, and the step of making the predetermined control comprises a step of controlling a gain of at least one of the power amplifier provided at the transmitter section and the low noise amplifier provided at the receiver section so that a signal level of the reflection wave at the receiver section is within a linear operation range of the linear multiplier.

18. The short range radar controlling method according to claim 12, characterized in that the step of radiating a short range wave to a space by means of the transmitter section comprises the steps of:

generating a pulse signal having a predetermined width;

making an oscillation operation only in a period in which the pulse signal is inputted to output an output signal as the short range wave; and stopping an oscillation operation during a period in which the pulse signal is not inputted so as not to output an output signal as the short range wave.

19. The short pulse radar controlling method according to claim 12, characterized in that the step of making the predetermined control comprises the step of:

stopping power supply to the transmitter section in a period in which the transmitter section radiates the short range wave to the space, and then, radiates a next short range wave to the space.

20. The short range radar controlling method according to claim 12, characterized in that the step of making the predetermined control comprises the step of;

stopping power supply to the receiver section in a period in which the transmitter section radiates the short range wave to the space, and then, radiates a next short range wave to the space except a period in which a signal of a reflection wave with respect to the short range wave radiated to the space is received by means of the receiver section.

21. The short range radar controlling method according to claim 12, characterized in that first and second receiver sections are provided as the receiver section, each of which has first and second receiving antennas provided to be spaced from each other with a predetermined distance in order to receive the reflection wave, and the step of carrying out the analyzing process comprises the step of analyzing a direction of an object which exists in the space based on output signals from the first and second receiver sections.

22. The short range radar controlling method according to claim 12, characterized in that, in the step of outputting the linearly multiplied signal, the Gilbert mixer used as the linear multiplier comprises:

a first differential amplifier comprising first and second transistors each having a base input end, a collector output end, and an emitter common current path, the emitter common current path of the first and second transistors being connected to a constant current source;

a second differential amplifier comprising third and fourth transistors each having a base input end, a collector output end, and an emitter common current path, the emitter common current path of the third and fourth transistors being connected to a collector output end of the first transistor of the first differential amplifier;

a third differential amplifier comprising fifth and sixth transistors each having a base input end, a collector output end, and an emitter common current path, the base input end of the fifth transistor being connected in common to the base input end of the fourth transistor of the second differential amplifier, the emitter common current path of the fifth and sixth transistors being connected to a collector output end of the second transistor of the first differential amplifier;

a first load resistor and a first output end connected in common to a collector output end of the third transistor of the second differential amplifier and a collector output end of the fifth transistor of the third differential amplifier, respectively;

a second load resistor and a second output end connected in common to a collector output end of the fourth transistor of the second differential amplifier and a collector output end of the sixth transistor of the third differential amplifier, respectively;

a first low pass filter including first and second coils and a first resistor and a second low pass filter including third and fourth coils and a second resistor connected in series, respectively, between a first pair of lines and an earth line which transmits the first signal branched in phase by means of the branch circuit;

a third low pass filter including fifth and sixth coils and a third resistor and a fourth low pass filter including seventh and eighth coils and a fourth resistor connected in series, respectively, between a second pair of lines and an earth line which transmits the second signal branched in phase by means of the branch circuit;

first and second emitter follower circuits comprising seventh and eighth transistors each having a base input end and an emitter output end, the base input ends of the seventh and eighth transistors each being connected to each of connecting neutral points of the first and second coils and the third and fourth coils as each of the output ends of the first and second low pass filters;

third and fourth emitter follower circuits comprising ninth and tenth transistors each having a base input end and an emitter output end, the base input ends of the ninth and tenth transistors each being connected to each of connecting neutral points of the fifth and sixth coils and the seventh and eighth coils as each of the output ends of the third and fourth low pass filters;

a fifth low pass filter composed of: a ninth coil connected between a common collector output end of the third transistor of the second differential amplifier and the fifth transistor of the third differential amplifier and the first load resistor; a tenth coil connected between the common collector output end of the third transistor of the second differential amplifier and the fifth transistor of the third differential amplifier and the first output end; and the first load resistor; and a sixth low pass filter composed of: an eleventh coil connected between a common collector output end of the fourth transistor of the second differential amplifier and the sixth transistor of the third differential amplifier and the second load resistor; a twelfth coil connected between the common collector output end of the fourth transistor of the second differential amplifier and the sixth transistor of the third differential amplifier and the second output end; and the second load resistor, wherein each of the base input ends of the first and second transistors of the first differential amplifier is connected to each of the output ends of the first and second emitter follower circuits, respectively, and thereby the first signal branched in phase by means of the branch circuit is inputted to the first differential amplifier, each of the base input ends of the third transistor of the second differential amplifier and the sixth transistor of the third differential amplifier is connected to each of the output ends of the third and fourth emitter follower circuits, respectively, and thereby the second signal branched in phase by means of the branch circuit is inputted to the second and third differential amplifiers, and thereby a linearly multiplied outputs of the first and second signals can be led out from at least one of the first and second output ends.

* * * * *